United States Patent
Matsuyama et al.

(10) Patent No.: US 7,532,091 B2
(45) Date of Patent: May 12, 2009

(54) PIEZOELECTRIC VIBRATOR, SURFACE-MOUNTING TYPE PIEZOELECTRIC VIBRATOR, OSCILLATOR, ELECTRONIC APPARATUS AND WAVE CLOCK

(75) Inventors: Masaru Matsuyama, Chiba (JP); Susumu Takigawa, Chiba (JP)

(73) Assignee: Seiko Instruments Inc. (JP)

( * ) Notice: Subject to any disclaimer, the term of this patent is extended or adjusted under 35 U.S.C. 154(b) by 410 days.

(21) Appl. No.: 11/350,663

(22) Filed: Feb. 9, 2006

(65) Prior Publication Data
US 2006/0176128 A1  Aug. 10, 2006

(30) Foreign Application Priority Data

Feb. 10, 2005 (JP) ............................. 2005-034734
Feb. 21, 2005 (JP) ............................. 2005-043334
Jan. 16, 2006 (JP) ............................. 2006-007705

(51) Int. Cl.
*H03H 9/54* (2006.01)
(52) U.S. Cl. ..................................... 333/187; 333/200
(58) Field of Classification Search .................. 333/187, 333/200
See application file for complete search history.

(56) References Cited

U.S. PATENT DOCUMENTS 5,229,640 A * 7/1993 Pak ............................. 257/666
6,590,314 B1 * 7/2003 Arahari et al. ............... 310/344

OTHER PUBLICATIONS

Patent Abstracts of Japan, publication No. 2000-165182, publication date Jun. 16, 2000.
Patent Abstracts of Japan, publication No. 2001-156574, publication date Jun. 8, 2001.
Patent Abstracts of Japan, publication No. 2002-204140, publication date Jul. 19, 2002.

* cited by examiner

*Primary Examiner*—Robert Pascal
*Assistant Examiner*—Alan Wong
(74) *Attorney, Agent, or Firm*—Adams & Wilks

(57) ABSTRACT

A piezoelectric vibrator has an airtight terminal including leads each having a plane portion. A vibrating piece includes a first part having a preselected thickness and a second part having a thickness smaller than the preselected thickness. The plane portion of each of the leads is connected to the second part of the vibrating piece. A case covers a periphery of the vibrating piece and is sealed on an outer circumference of the airtight terminal.

20 Claims, 14 Drawing Sheets

FIG. 13A
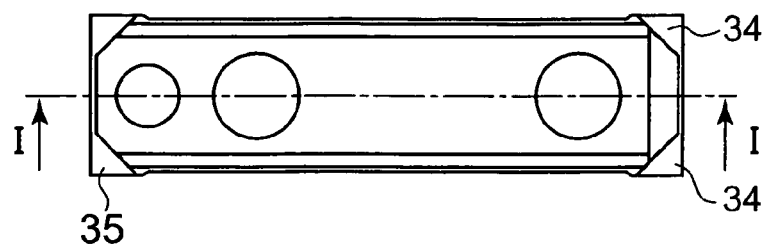
FIG. 13B  FIG. 13E
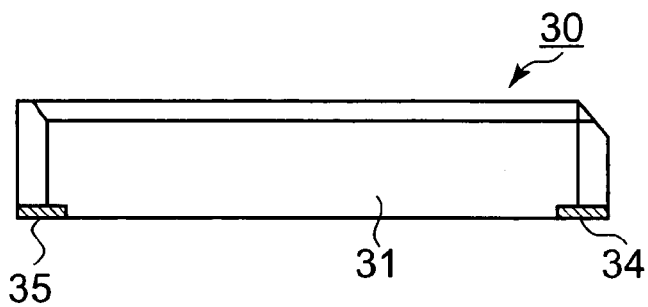 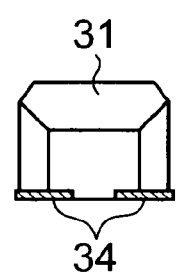
FIG. 13C
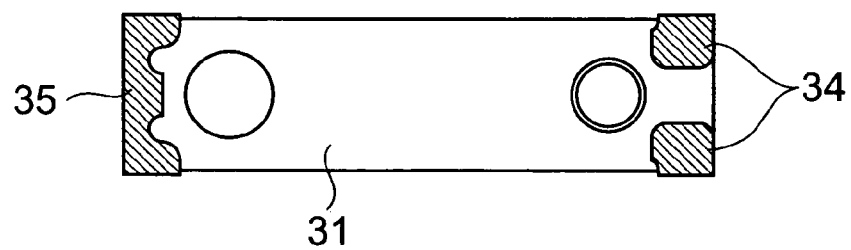
FIG. 13D
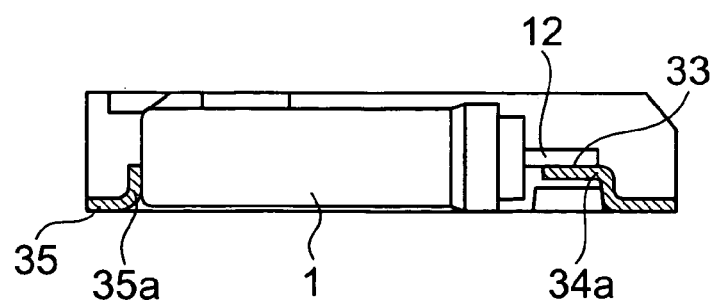

PIEZOELECTRIC VIBRATOR, SURFACE-MOUNTING TYPE PIEZOELECTRIC VIBRATOR, OSCILLATOR, ELECTRONIC APPARATUS AND WAVE CLOCK

FIELD OF THE INVENTION

The present invention relates to a piezoelectric vibrator having a vibrating piece made of a piezoelectric substance, a surface-mounted piezoelectric vibrator, an oscillator using such a piezoelectric vibrator, and a surface-mounted piezoelectric vibrator, an electronic apparatus, and a wave clock.

DESCRIPTION OF THE RELATED ART

The piezoelectric vibrator is used in various electronic apparatus such as a communication apparatus or a measurement apparatus for both consumer and industrial use. With recent miniaturization, thinning, and weight saving of these apparatus, a piezoelectric vibrator has also been strongly required to be capable of miniaturization, and to be thin and light in weight.

In downsizing a piezoelectric vibrator, such as a piezoelectric vibrator sealed with a cylindrical or cylinder-type case, there has been a problem in the mount accuracy of a vibrating piece mounted into the piezoelectric vibrator for the lead passing through airtight terminal.

FIGS. 17A and 17B show an example of a conventional cylindrical piezoelectric vibrator. FIG. 17A shows a view showing an internal structure by vertically cutting the cylindrical case, FIG. 17B is an enlarged cross-sectional view taken along the cutting line J-J shown in FIG. 17A.

As shown in FIG. 17A, a cylindrical piezoelectric vibrator 1' includes an airtight terminal 13 which fixes and retains two leads 12 with glass filling material or the like by rendering the leads passing through the same, a vibrating piece 10' which is connected to the lead 12, and a case 16' which is sealed in the outer circumference of airtight terminal 13 such that the vibrating piece 10' is to be covered thereby. The vibrating piece 10', which is made of quartz crystal serving as piezoelectric substance, is processed from a quartz crystal wafer state into a tuning-fork shape by using photolithography technology. The connection between the vibrating piece 10' and the lead 12 is established in the mount part 11' of the vibrating piece 10'. The outer circumference of the airtight terminal 13 is formed into a coated metal ring and pressed to be engaged with the internal periphery of a metallic case 16'. This cylindrical piezoelectric vibrator will be termed simply a piezoelectric vibrator.

As shown in FIG. 17B, the inner diameter of the case 16' becomes smaller in accordance with miniaturization of a piezoelectric vibrator. Hence, the gap between the vibrating piece 10' in the case 16' and an internal surface 15 of the case is extremely small. As one of causes for this, there is a problem of a radial position of the two leads 12 passing through the airtight terminal 13.

As is evident from FIG. 17B, the line which connects the respective centers of the wire diameters of the two leads 12 passes through the center of the case 16', that is, the center of the airtight terminal 13. Since these two leads 12 is disposed in the center of the case 16', the vibrating piece 10' connected to the side of these leads 12 is away from the center of the case 16'.

As a means for solving this problem, there is a first idea for decentering the center of the line connecting the respective centers of wire diameters of the two leads 12 from the center of the airtight terminal 13.

However, if the lead 12 becomes close to the outer circumference of the airtight terminal 13, insulation failure might occur because the outer circumference of the airtight terminal 13 is a metallic ring. In case of the first idea, the distance between the two leads 12 is 4 or 5 times as long as the wire diameter of the lead 12. Hence, there is a possibility that insulation failure can be prevented by plugging up the distance between the two leads 12 to the degree that the leads 12 become closer to the metallic ring. However, in a piezoelectric vibrator 1' as shown in FIG. 17, which is further miniaturized, the distance is almost as long as only a wire diameter of the lead 12, and thus it is difficult to close up the distance any more.

Moreover, there is a second idea for forming an inclined plane on the side of the lead 12 connected to the mount part 11' of the vibrating piece 10' or bending the lead 12, as another solving means for the problem of the vibrating piece 10' departing from the center of the case 16'.

However, processing equipment with high accuracy and high figure is required to provide an inclined plane having a desired angle in the thin lead 12, or bend it by a desired angle. Furthermore, when the vibrating piece 10' is mounted, processing equipment with high accuracy and high figure is similarly required.

As the exterior figure of the piezoelectric vibrator 1' becomes smaller, it is necessary that the size of each member inside the piezoelectric vibrator 1' should become smaller. Since the mount area of the vibrating piece 10' and the lead 12 becomes small, the mount strength can not be retained, and thus there is a problem of giving a negative effect on the characteristics such as the frequency, the disparity of the CI value, etc.

Consequently, the accuracy for mounting the vibrating piece 10' on the lead 12 inside the piezoelectric vibrator 1' is strictly required a difficult. In conventional technologies, as shown in FIG. 17B, the position in which the lead 12 is fixed with the vibrating piece 10' has depended on the accuracy of a jig retaining each of them since the mount part 11' of the vibrating piece 10' is formed with a plane having no level difference. If the inside of a retaining jig has much spacing, the position is dispersive, and thus the displacement of the vibrating piece 10' to right and left or the incline occurs.

As a solution for this problem, there is a third idea for positioning the inner lead by providing a concave portion in the rear anchor portion of the quartz crystal vibrating piece.

Only, this idea is applied to a case of a large piezoelectric vibrator having enough space inside a piezoelectric vibrator, such as an AT cut piezoelectric vibrator, and thus is not enough for mounting with high accuracy in a small piezoelectric vibrator 1'.

If the shape of the piezoelectric vibrator 1' is large, the diameter of the inner wall surface 15 of the case 16' becomes large. Therefore, the acceptable value of the displacement of the vibrating piece 10' to right and left or the inclination has been large, but in accordance with miniaturization of a piezoelectric vibrator, the diameter of the inner wall surface 15 becomes small, and as a result, the acceptable value for the disposition of the vibrating piece 10' to right and left or the inclination becomes small. In case that the vibrating piece 10' is mounted on the lead 12 with such disposition or inclination exceeding the acceptable value, the vibrating piece 10' comes into contact with the inner wall surface 15 of the case 16', and thus causing a problem, such as oscillation failure.

Moreover, the vibrating piece 10' is connected to an external oscillating circuit through the lead 12 and excited with characteristic frequency, but at this time, the vibrating energy of the vibrating piece 10' is transferred to the lead 12 and leaked to an external on occasion. If the vibrating energy is leaked to the external, the confined energy becomes insufficient, thus causing a rise of equivalent resistance or change of frequency. To avoid this trouble, various ingenuities have been made heretofore such that the leakage of the vibrating energy could be lowered for the shape or size of the vibrating piece 10' or the lead 12; for example, making the size of the base portion of the vibrating piece 10' larger than the vibrating portion or making a constriction in the side of the base portion.

However, as the piezoelectric vibrator 1' becomes smaller, the size of vibrating piece 10' becomes compact. Therefore, it has been more difficult to take ingenuities on shape or size to prevent the above-described leakage of the vibrating energy. Furthermore, since the good mount area to minimize the leakage of the vibrating energy is narrower than a conventional mount area, mount position accuracy into the lead 12 of the vibrating piece 10' becomes increasingly important.

As described above, in conventional piezoelectric vibrator, since the vibrating piece is out of the center, by the disparity of the mount position of the vibrating piece and the lead, vibrating piece contacts the case, and there is characteristic failure. Moreover, after the product with the small clearance between the vibrating piece and the case is launched, the trouble is made by impact such as fall, etc. specifically, the miniaturization of the product is required nowadays, further there is the problem that the clearance between the vibrating piece and the case is ensured. Moreover, the mount area of the vibrating piece and the lead 12 is reduced by miniaturization, the mount strength is not retained, and there is the problem that the characteristics of the frequency, variation of CI value, etc. is given negative effect.

SUMMARY OF THE INVENTION

According to above-described problem, while the present invention can achieve miniaturization without losing electrical insulation, the present invention improves the mount accuracy and the mount strength in the lead of the vibrating piece, and achieves stabilization of the vibrating characteristics, and provide a piezoelectric vibrator manufactured with low cost.

To solve the problem, in structure 1 according to the present invention, a piezoelectric vibrator includes an airtight terminal having two leads, a vibrating piece connected to the lead and a case covering a periphery of the vibrating piece and sealed on an outer circumference of the airtight terminal, wherein a level difference is provided in a mount part of the vibrating piece fixed to the lead.

It is preferable that the depth of the level difference is 20% or more and 70% or less of the thickness of the vibrating piece. Moreover, the level difference may be provided at two places of one side of the vibrating piece corresponding to the leads, and the level difference may be provided at each one place both sides of the vibrating piece, respectively. In case that a level difference is provided only in one side, a center of a line segment connecting line diameter center of each of the two leads may be further eccentric from a central axis of the airtight terminal in the piezoelectric vibrator. In case that a level difference is provided in both sides of the vibrating piece respectively, the vibrating piece can be connected to interpose the vibrating piece between the two leads.

Moreover, in structure 2 according to the present invention, a piezoelectric vibrator includes an airtight terminal having two leads, a vibrating piece connected to the lead and a case covering a periphery of the vibrating piece and sealed on an outer circumference of the airtight terminal, wherein, in the lead and a mount part of the vibrating piece, the lead has a plane portion, and the vibrating piece has a thin portion.

It is preferable that the thickness of the thin portion is 30% or more and 80% or less of the thickness of the vibrating piece. Moreover, the thin portion may be formed to have a level difference only in one side of the vibrating piece and the thin portion may be formed to have a level difference in both sides of the vibrating piece respectively. In the thin portion having a level difference only in one side, a center of a line segment connecting line diameter center of each of the two leads may be further eccentric from a central axis of the airtight terminal in the piezoelectric vibrator. In the thin portion having, a level difference in both sides of the vibrating piece respectively, the vibrating piece may be connected to interpose the vibrating piece between the two leads.

Moreover, in structure 3 according to the present invention, a piezoelectric vibrator includes an airtight terminal having two leads, a vibrating piece connected to the lead and a case covering a periphery of the vibrating piece and sealed on an outer circumference of the airtight terminal, wherein, in, the lead and a mount part of the vibrating piece, an end face of the lead and an end face of the vibrating piece are connected to be abutted each other. The plane portion is provide in a side face of the two leads in the mount part, thereby may be connected to interpose the vibration piece between the plane portions.

Moreover, in structure 4 according to the present invention, a surface-mounting type piezoelectric vibrator includes a mold resin covering a surface of piezoelectric vibrator of structures 1 to 3 and an external electrode terminal partially exposed from the mold resin.

Moreover, in structure 5 according to the present invention, an oscillator connects the piezoelectric vibrator of structures 1 to 3 or the surface-mounting type piezoelectric vibrator of structure 4 to an integrated circuit as an oscillating device.

Moreover, in structure 6 according to the present invention, an electronic apparatus connects the piezoelectric vibrator of structures 1 to 3 or the surface-mounting type piezoelectric vibrator of structure 4 to a timing unit.

Moreover, in structure 7 according to the present invention, a wave clock connects the piezoelectric vibrator of structures 1 to 3 or the surface-mounting type piezoelectric vibrator of structure 4 to a filter unit.

According to the first structure of the present invention, by providing a level difference in the mount part of a vibrating piece, since the position which the vibrating piece and a lead mounting the vibrating piece can be fixed on is limited, the amount of deviance or perpendicularity is small, and thereby mount accuracy is improved. Herewith, in case that the size of piezoelectric vibrator is miniaturized, it can be prevented that the vibrating piece contacts the inner wall surface of the vibrating piece. Furthermore, since mount accuracy is improved, variation of leakage rate of vibrating energy from external is suppressed, and thereby equivalent resistance of piezoelectric vibrator or the stabilization of frequency can be achieved. Moreover, since the vibrating piece approach the center axis of the airtight terminal by providing the level difference, the electrical insulation between the outer circumference and the lead, and between two leads is secured, and the miniaturization is easier. Additionally, since the contact area contacting the vibrating piece and the leads, the sticking tendency is easier. Additionally, since the area which vibrating piece and the lead contact is expanded, a sticking tendency is boosted, and the strength is improved, and thereby the drop shock resistance performance of piezoelectric vibrator can be boosted.

According to the second structure of the present invention, in a mount part of the lead and vibrating piece, the plane portion is provided in the lead, and thin portion is provided in the vibrating piece, further, since the vibrating portion can be center of case, the clearance between inner wall of case and the vibrating piece is securely taken. Moreover, the area of the vibrating piece and the lead is reduced by miniaturization of the vibrating piece, because the plane portion provided in the lead and the plane portion of vibrating piece is fixed by flat surface to flat surface, mount strength is improved.

In the first structure or the second structure, the level difference is provided in both side of the vibrating piece, and is connected so that the vibrating piece is between two leads, since the vibrating piece can be disposed in the center of case, the clearance between the inner wall surface and the vibrating piece can be maximized. Moreover, the inner diameter of case can be smaller. Furthermore, since the vibrating piece is inserted to two leads, the vibrating piece has the structure with the good balance of rotational symmetry, thereby residual stress of the vibrating piece by heat during mount is uniformed and the stability of characteristic of the oscillating frequency, etc. is improved.

According to the third structure of the present invention, while the vibrating piece is disposed at center of case by the structure in which the end face of the lead and the end face of the vibrating piece are connected to be abutted each other, the disparity of long direction disappear in the lead connecting portion. Therefore, the clearance between the edge of vibrating piece and basal plane as well as the clearance between the side of the vibrating piece and the inner wall surface of case can be minimized, thereby a further miniaturization of piezoelectric vibrator can be achieved. Moreover, the structure in which the plane portion as the side of the lead is provided and the vibrating piece is therebetween is fixed by flat surface to flat surface, thereby the mount strength is improved, and the drop shock resistance performance is further improved.

As described above, since the mount position is stabilized than conventional method in spite of the miniaturization, the piezoelectric vibrator of the present invention can secure the clearance of the case and thereby the mount strength can be improved. Therefore, characteristic failure by the contact of the vibrating piece and the case and characteristic disparity of the disparity of frequency and CI value, etc. can be reduced.

According to structure 4 of the present invention, surface-mounting type piezoelectric vibrator is provided suitable for reflow soldering by surface-mounting type piezoelectric vibrator using the piezoelectric vibrator according to some of structure 1 to 3.

According to structure 5 to 7 of the present invention, the piezoelectric vibrator or surface-mounting type piezoelectric vibrator is used for various electronic apparatuses, the reliability of these electronic apparatuses is improved.

BRIEF DESCRIPTION OF THE DRAWINGS

FIG. 1A is a view showing an internal structure by vertically cutting a cylindrical case, FIG. 1B is an enlarged cross-sectional view taken along the cutting line A-A shown in FIG. 1A.

FIG. 3A is a view showing an internal structure by vertically cutting the cylindrical case, FIG. 3B is an enlarged cross-sectional view taken along the cutting line B-B shown in FIG. 3A.

FIG. 8A is a view showing an internal structure by vertically cutting a cylindrical case, FIG. 8B is an enlarged cross-sectional view taken along the cutting line E-E shown in FIG. 8A.

FIG. 9A is a cross-sectional view showing a mount part in the condition of the present invention, FIG. 9B is the cross-sectional view showing a mount part in conventional condition.

FIG. 10A is a view showing an internal structure by vertically cutting a cylindrical case, FIG. 10B is an enlarged cross-sectional view taken along the cutting line F-F shown in FIG. 10A.

FIG. 11A is a view showing an internal structure by vertically cutting a cylindrical case, FIG. 11B is an enlarged cross-sectional view taken along the cutting line G-G shown in FIG. 11A.

FIG. 12A is a view showing an internal structure by vertically cutting a cylindrical case, FIG. 12B is an enlarged cross-sectional view taken along the cutting line H-H shown in FIG. 12A.

FIGS. 13A to 13E are a view showing a structure of the surface-mounting type piezoelectric vibrator according to the fourth embodiment, FIG. 13A is a plan view shown from above, FIG. 13B is a front view, FIG. 13C is a bottom view, FIG. 13D is a cross-sectional view taken along the cutting line I-I shown in FIG. 13A, FIG. 13E is a side view shown from the right side of the front view shown in FIG. 13B.

FIG. 17A is a view showing an internal structure by vertically cutting the cylindrical case, FIG. 17B is an enlarged cross-sectional view taken along the cutting line J-J shown in FIG. 17A.

DETAILED DESCRIPTION OF PREFERRED EMBODIMENTS

Hereinafter, embodiments of the present invention are described in detail with reference to the drawings.

First Embodiment

Figure 1A:
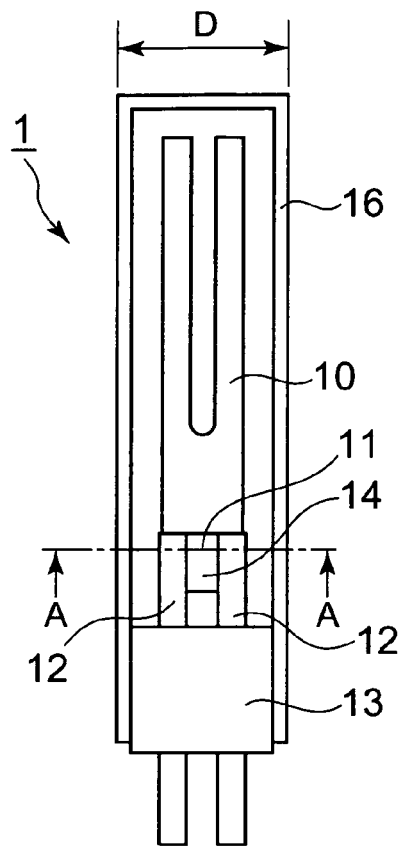
FIGS. 1A and 1B are a view showing an example of piezoelectric vibrator according to the first embodiment.
Figure 1B:
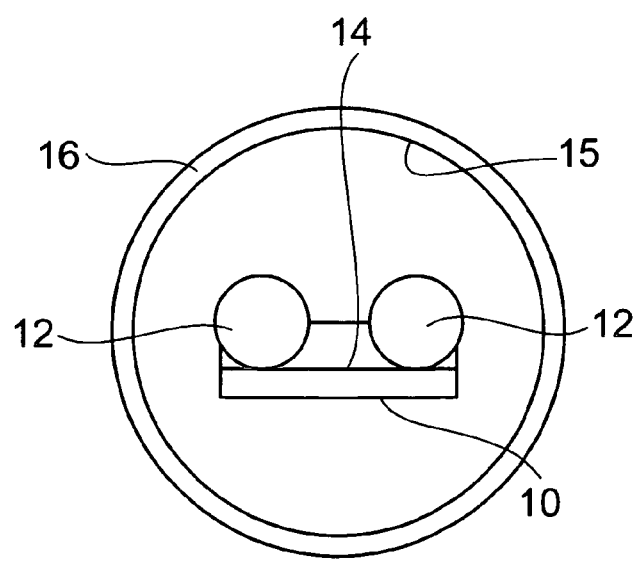
Figure 2:
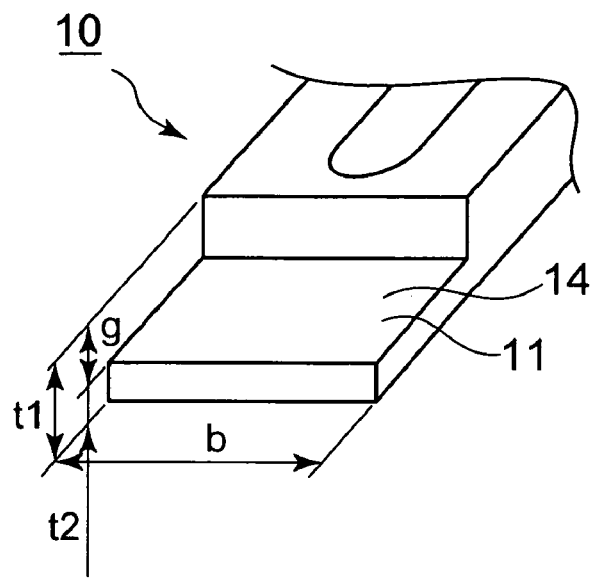
FIG. 2 is a perspective view showing a mount part of the vibrating piece shown in FIGS. 1A and 1B in detail.

FIGS. 1A, 1B and FIG. 2 are the views showing the example of piezoelectric vibrator corresponding to the first embodiment, FIG. 1A is the view showing inner structure of cylindrical case vertically cut, FIG. 1B is an enlarged cross-sectional view taken along cutting line A-A shown in FIG. 1A. FIG. 2 is side view showing the detail of mount of the vibrating piece shown in FIGS. 1A and 1B.

As shown in FIG. 1A, piezoelectric vibrator 1 has the airtight terminal 13 including two leads 12, the vibrating piece 10 connected to the lead 12, and the case 16 sealing up the circumference of airtight terminal 13 covering the vibrating piece 10. The inside of the case 16 having the vibrating piece 10 is airtightly sealed up in vacuum.

The two leads 12 are made from wire rod of conductive material such as low carbon steel, Fe-Nickel alloy or Fe—Ni—Co, etc., and are cut in predetermined length.

The airtight terminal 13 is structured by the trunk unit called the stem of the metal ring shape, the two leads 12 passing through the trunk unit, and the sealing glass mechanically fixing them with electrical insulation. The surface of the trunk unit and the lead 12 are provided with solder plating. The solder of this solder plating uses Sn—Cu alloy to correspond to lead free, but Sn—Pb may be used.

The vibrating piece 10 is formed in tuning fork shape by using the quartz crystal as piezoelectric material. In the quartz crystal vibrating piece 10 of this tuning fork shape shown in FIG. 1A, the two portions parallel located in top and bottom is a vibrating arm, the portion formed in the bottom mount part 11 of the vibrating arm is a base portion. In this embodiment, the vibrating piece 10 is about 50 μm in thickness, and can be formed within about 200 μm.

In the surface of the vibrating piece 10, exciting electrodes (not shown) for vibrating the vibrating arm are formed in two vibrating arm portions respectively. Moreover, to flow current to these exciting electrodes, mount electrodes (not shown) electrically connected to two leads 12 respectively are formed in mount part 11. These exciting electrodes or mount electrodes are formed with the thin film of Cr and Au, but it is preferable in thin film of Al.

The cylindrical case 16 is made of metal, and there is a bottom in a side of end portion, unilateral end portion is opened. The opening end is formed with internal diameter which can inject and connect the periphery of the stem provided with solder plating of the airtight terminal 13. The outer diameter D of this case 16 becomes the diameter of piezoelectric vibrator 1, and is various sizes, is about 1.0 mm shown in the present embodiment. Recently, the miniaturization of piezoelectric vibrator is further required, but it is not easy that this 1.0 mm diameter is attained in tuning fork quartz crystal vibrator.

Here, the mount part 11 of the vibrating piece 10 is described in detail.

As shown in FIGS. 1A and 1B, the level difference is formed in mount part 11 located in base portion of vibrating piece 10. Since this level difference is formed to configure thinner portion 14 than the vibrating arm of vibrating portion 10, the position of the vibrating piece can approach the center portion of piezoelectric vibrator 1. Apparently from FIG. 1B in corner portion of two places in axial section of vibrating piece 10, the distance from the inner wall surface 15 of case 16 has increased ever before.

Here, according to FIG. 2, the definition of the level difference in which the thin portion 14 is formed in the mount part 11 is provided.

As shown in FIG. 2, the mount part contour is formed with thickness t1 and base width b. Since the thin portion 14 of thickness t2 is formed in the mount part 11, two leads 12 are connected to the surface of this thin portion 14. The level difference is made of size g, length subtracting thickness t2 of the thin portion 14 from thickness t1.

The level difference g is set to 20% or more of the thickness of the vibrating piece 10, while the size is set to 70% or less. That is, as the embodiment, in case that t1 is 50 μm, the level difference g is set to the range of from 10 μm to 35 μm. In case that the level difference g is 20% or less of the thickness t1 of the vibrating piece 10, the level difference g is so thin to reduce the effect restricting the position of the lead 12 relating to longitudinal direction of vibrating piece 10. Moreover, the level difference is 70% or more to the thickness t1 of the vibrating piece 10, the level difference is so deep that the effect restricting the position of the lead 12 may be improved, but the machining time increases and the mount 11 own strength may be degraded.

The setup of the actual level difference g is set to the size that the forefront portion of tuning fork arm of vibrating piece 10 is not connected the inner wall surface 15 of the case 16 in accordance with obtaining the strength of the thin portion 14 in consideration of connecting vibrating piece 10 to the cylindrical side of two leads 12 of the airtight terminal 13. Additionally, instead of the setup of level difference g, the thickness t2 of thin portion 14 may be set up. In case of managing with the thickness t2 of the thin portion 14, t2 is set to 30% or more and 80% or less of thickness t1 f the vibrating piece 10.

Next, the manufacturing method of this vibrating piece 10 is described.

In the manufacturing process of the vibrating piece 10, first, lumbered raw stone of quartz crystal is set as the work table with X-ray diffraction method to get to a predetermined cutting angle. Second, quartz crystal raw stone is sliced by the cutting apparatus, for example, wire saw, etc. and cut about thickness of 200 μm, thereby a quartz crystal wafer is formed. Conventionally, free abrasive grains with a large grain size is usually used for the cutting, furthermore, the cutting wire, for example, the high-carbon steel wire with the diameter of about 160 μm, is usually used.

Next, the quartz crystal wafer is ground up to a predetermined definite thickness. For grinding, rough lapping is usually performed using free abrasive grains with a large grain size. Finish lapping is then performed using free abrasive grains with a small grain size. Then, after the surface is etched and the affected layer is removed, the polishing process is implemented, and the finishing is performed on the specular surface with predetermined thickness and flatness. The thickness of the quartz crystal wafer becomes thin with the miniaturization of the vibrating piece 10, in case that the whole length of vibrating piece is about 1600 μm, the thickness of the quartz crystal wafer becomes about 50 μm.

Subsequently, after the quartz crystal wafer is washed with pure water or super pure water, and dried, metallic thin film for mask predetermined is deposited after film thickness by sputtering, etc. The layered film of Cr and Au is conventionally this metallic thin film and deposited on both sides of the wafer.

Next, by photolithography technology, a contour of the vibrating piece 10 is formed on tuning fork shape. Concretely, after the application of a resistor, a mask for the contour exposes both sides, implements the development and obtains the resistor pattern of contour. Then, unnecessary metallic pattern is removed by etching liquid and metallic mask pattern is obtained. After the resistor is removed, the quartz crystal is etched with aqueous solution of hydrofluoric acid series, a plurality of the contours are formed on the quartz crystal wafer. When this contour is formed, the thin portion 14 having the level difference g shown in FIG. 2 is simultaneously formed in the mount part 11 of the vibrating piece 10.

Conventionally, with the miniaturization of piezoelectric vibrator, the ratio of the width of one vibrating arm to the thickness of the vibrating arm (vibrating arm width/vibrating arm thickness t) is reduced. Specifically, if this ratio is smaller than 1.0, electric field efficiency for the vibrating arm of tuning fork piezoelectric vibrator is lowered, thereby resonant resistance value of piezoelectric vibrator increases, for example, over 100 k$\Omega$, is undesirable. As this measure, a groove not shown in vibrating arm may be formed by the purpose that electric field efficiency increases and the resistance decreases. A method of forming the contour or the groove is a micro-blast method using fine particle for polishing or dry etching method, etc. as well as photolithography, and any method is preferable.

As described above, after the contour or after the contour and groove of the vibrating 10 is formed, the metallic thin film used as mask is once striped off. After stripping off, the metallic thin film with the predetermined film thickness is deposited on both sides of the quartz crystal wafer by sputtering, etc. The material of this conductive metallic thin film is same as the metallic thin film for contour formation, and the layered film of Cr and Au. It is possible that the method of forming a film is a deposition method or plating method as well as sputtering. In case that the groove is formed as described above, the film is formed inside the groove.

After the electrode film is deposited, the pattern of the electrode film is formed as same as the above-described contour formation process by using photolithography technology. When this electrode film pattern is formed, the exciting electrode is formed in the vibrating arm and the mount electrode is formed in the surface of the thin portion 14 of mount part 11, respectively and polar characteristically. Although Au based on Cr is effectively used for the material for the mount electrode, in case of soldering as following process, considering characteristics of the solder wettability, the alloy film of Ni—Cr may be formed on the Cr surface of the base by the sputtering.

The quartz crystal wafer in which the pattern of the electrode film is formed is then formed a weight film in the thickness of several μm on the tip region of the vibrating arm. A deposited layered film of Cr, Ag or Au is conventionally used as the material of the weight film.

Next, There is a frequency trimming (rough trimming) process. Irradiating weighted portion with laser, etc. in on a portion in the atmosphere, measuring the oscillating frequency, the frequency is adjusted in the predetermined range by evaporating the portion of the weight film deposited by the previous process.

After frequency trimming, with ultrasonic cleaning of the quartz crystal, residuum or adhesive foreign material of the film is removed by the frequency regulation, etc. By the above-described process, a quartz crystal wafer having a plurality of the vibrating pieces 10 are completed. The quartz crystal wafer is cut and separated to each vibrating piece 10.

Next, there is the description of the piezoelectric vibrator assembling process which assembles the piezoelectric vibrator 1 shown in FIG. 1A by using the cut and separated vibrating piece 10.

The first process is a mounting process which connects the vibrating piece 10 to the lead 12 of the airtight terminal 13. In the mounting process, the airtight terminal 13 is retained with a plurality of arrays in the arranging jig, that is, a pallet. The cut and separated thin piece 14 of the vibrating piece 10 is connected to the side of the lead 12 of the arranged airtight terminal 13. The connecting method is a heating fusion where the solder plating implemented on the lead 12 connected to the thin portion 14 of the vibrating piece 10 or the method using conductive adhesive, etc.

With connecting the thin portion 14 of above-described vibrating piece 10 to the side of the lead 12, it is possible that the vibrating piece 10 is disposed adjacent to the center position of the case 16, can be far away from the inner wall surface 15 of the case 16.

Then, the frequency is adjusted by trimming (fine trimming) the metallic film previously connected on the vibrating arm of the vibrating piece 10. Furthermore, in vacuum, the airtight terminal 13 is connected with the case 16, and the internal vibrating piece 10 is sealed airtight. Accordingly, the piezoelectric vibrator is manufactured.

The thin portion 14 of the above-described vibrating piece 10 is connected to the lead 12 and the vibrating piece 10 is disposed in the center position of the case 16, thereby longitudinal position taken by the lead 12 with the vibrating piece 10 is restricted. Therefore, in case of the miniaturized piezoelectric vibrator 10, it is impossible that the inner wall surface 15 of the case 16 is contacted with the vibrating piece 10. Moreover, since the accuracy of the mount position is improved, the disparity of leakage rate to an exterior of vibrating energy is suppressed, and the stabilization of the equivalent resistance or frequency of the piezoelectric vibrator 1 is achieved.

Next, the first modified example according to the first embodiment is described based on the views.

Figure 4:
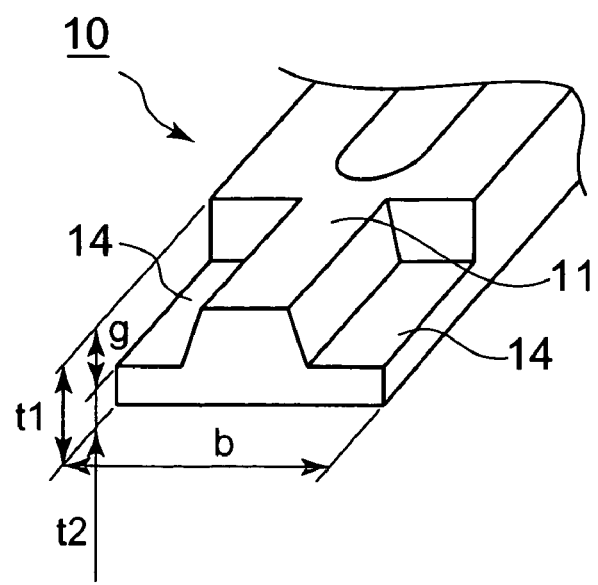
FIG. 4 is a perspective view showing a mount part of the vibrating piece shown in FIGS. 3A and 3B in detail.
Figure 3A:
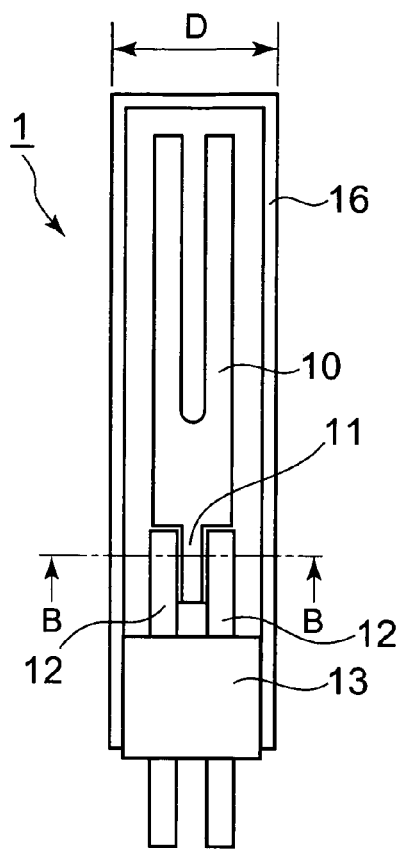
FIGS. 3A and 3B are a view showing a modified example of a piezoelectric vibrator according to the first embodiment.
Figure 3B:
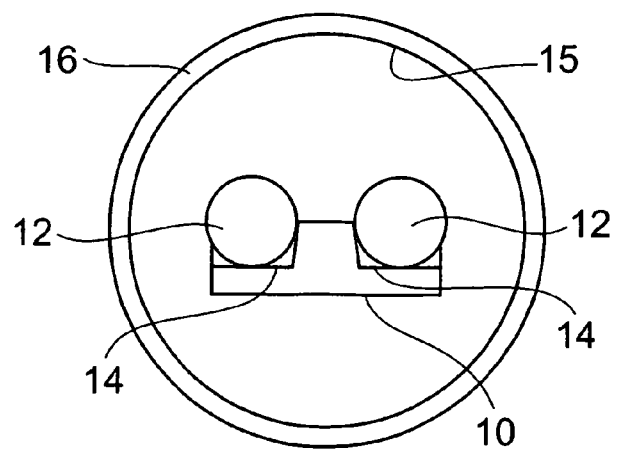

FIGS. 3A, 3B and FIG. 4 are the views showing the modified example of piezoelectric vibrator according to the first embodiment, FIG. 3A is a view showing an internal structure by vertically cutting cylindrical case and FIG. 3B is an enlarged cross-sectional view of the mount part taken along the cutting line B-B shown in FIG. 3A. FIG. 4 is a side view showing the mount part of the vibrating piece shown in FIGS. 3A and 3B. In the piezoelectric vibrator shown in FIGS. 3A, 3B and FIG. 4, the same numeral reference is given to the component with the same name as the component described in the above-described embodiment.

The modified examples shown in FIGS. 3A, 3B and FIG. 4 are different from the above-described embodiment in the point of the only portion relating to the mount part 11 of vibrating piece 10. Other portion is common, and the explanation of the common portion is omitted.

As shown in FIGS. 3A and 3B, in the modified example of the piezoelectric vibrator 1, there are provided two thin portions 14 corresponding to the two leads 12 respectively in the mount part 11 of the vibrating piece 10. In the mount part 11 of the above-described embodiment, the level difference g is formed in only one side, the two leads 12 were connected to the one thin portion 14.

As shown in FIG. 3B, in the mount part 11 of the vibrating piece 10, the central portion inserted to two leads 12 is formed in original plate thickness. As shown in the above-described embodiment, the level difference is provided in the nearly entire surface of the mount part 11, and without a wideness thin portion, the level difference g is provided only on the thin portion 14 of two places in the portion corresponding to these two leads 12, the position for base width b direction can be precisely determined as well as the longitudinal direction of the vibrating piece 10. Therefore, since the accuracy of mount position of the vibrating piece is improved, the disparity of leakage quantity of vibrating energy to an exterior is suppressed, and the stabilization of the equivalent resistance or the frequency of the piezoelectric vibrator is achieved. However, to acquire the positioning accuracy for the base width b direction of the vibrating piece 10, the level difference g in two places is deep as 20% or more and 70% or less as the thickness t1 of the vibrating piece 10, and it is preferable that the 30% or more and 100%. or less of the diameter of the lead 12 is formed to enter the inside of the level difference g.

As shown in FIG. 4, the vibrating piece 10 according to this modified example, the level difference g is set up with original thickness t1 in the central portion and two thin portion 14 of the thickness t2 is provided so that two leads 12 is connected respectively. Accordingly, since it is difficult to bend the vibrating piece 10, the handling is easy. Moreover, by remaining the original thickness t1 in the central portion, the side wall having the height of level difference g is formed. Accordingly, in the side wall of one lead 12, since the plane of the thin portion 14 and the sheer side wall are connected, the connecting area is enlarged and the connecting strength is more strongly obtained.

Further, the side wall having the height of level difference g with original thickness t1 of the vibrating piece 10, the mount electrode described with embodiment can be formed by the same method.

Figure 5:
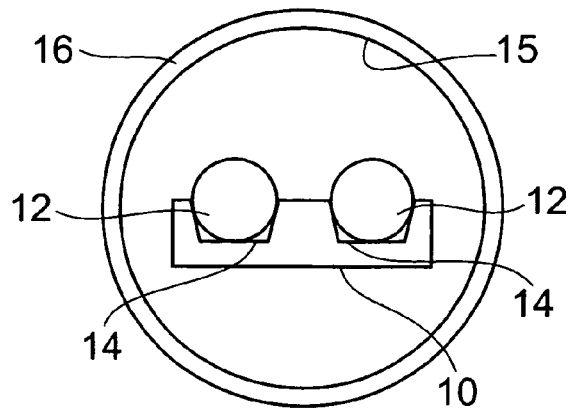
FIG. 5 is a view showing the second modified example of the piezoelectric vibrator according to the first embodiment.

Furthermore, there is a description of the second modified example according to the first embodiment based on FIG. 5.

FIG. 5 is a view showing the second modified example of the piezoelectric vibrator according to the first embodiment, is a view showing the enlarged cross-sectional view at the cutting places located in the same position as the cutting line A-A shown in FIG. 1 and the cutting line B-B shown in FIG. 3. In this second modified example, the same numeral reference is given to the component with the same name as the component described in the above-described embodiment or the first modified example. The second modified example of this piezoelectric vibrator 1 is different from the above-described embodiment in the portion relating to the mount part 11 of the vibrating piece 10. The other portion is common and the explanation of the common portion is omitted.

As shown in FIG. 5, in the second modified example of the piezoelectric vibrator 1, the base portion width b of the vibrating piece 10 is slightly large, is slightly larger than the gross width size of two paralleled leads 12. In this mount part 11 of the vibrating piece 10, the thin portions 14 of two groove shapes are provided in correspondence to the two leads 12. Herewith, in one lead 12, the vibrating piece is connected to one lead 12 in three sides. Therefore, the vibrating piece 10 connected to one lead in 3 sides is more enlarged than the vibrating piece 10 of the structure connected to one lead 12 in two sides in the above-described modified example, thereby the connecting strength can be more strongly secured.

Figure 6:
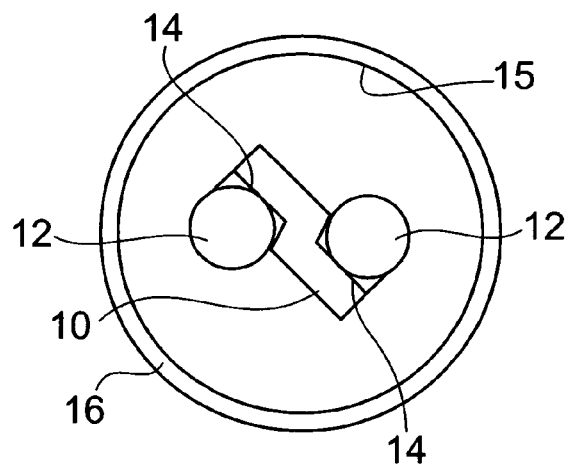
FIG. 6 is a view showing the third modified example of the piezoelectric vibrator according to the first embodiment.

Furthermore, there is a description of the third modified example related to the first embodiment according to FIG. 6.

FIG. 6 is a view showing the third modified example of the piezoelectric vibrator according to the first embodiment, and FIG. 6 is an enlarged cross-sectional view at the cutting places located in the same position as the cutting line A-A shown in FIG. 1 and the cutting line B-B shown in FIG. 3. In the third modified example, the same numeral reference is given to the component with the same name as the component described in the above-described embodiment or the first modified example. In the third modified example of the piezoelectric vibrator, the different point from the above-described embodiment is only the portion relating to the mount part 11 of the vibrating piece 10. The other portion is common and the explanation of the common portion is omitted.

As shown in FIG. 6, in the third modified example of this piezoelectric vibrator 1, the thin portion 14 of the mount part 11 of the vibrating piece 10 is characterized in that the places are provided in rotational symmetry by the level difference g in two places as one place from surface and another place from rear surface. As described above, the level difference g is set up from both sides of the vibrating piece 10, and the vibrating piece 10 is connected to be inserted between two leads 12 by configuring the thin portion 14. From the vibrating piece 10 to be disposed between two leads 12, in this piezoelectric vibrator 1, the vibrating piece 10 is disposed as central axis of this piezoelectric vibrator 1. Therefore, the distance between the front end of the vibrating piece 10 and the inner wall surface 15 of the case 16 can be maximized.

Figure 7:
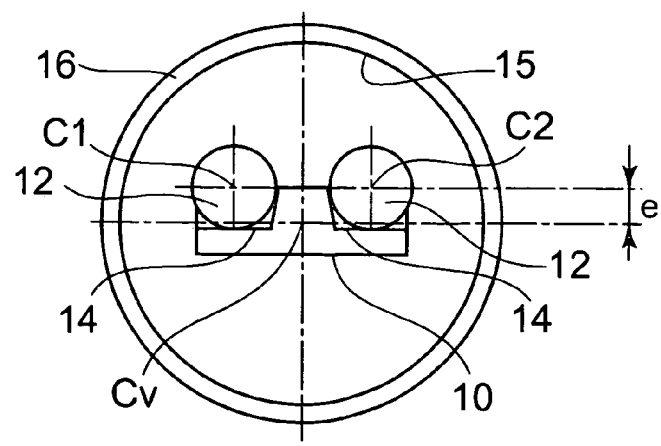
FIG. 7 is a view showing the fourth modified example of the piezoelectric vibrator according to the first embodiment.

Furthermore, the fourth modified example according to the first embodiment is described based on FIG. 7.

FIG. 7 is a view showing the fourth modified example of the piezoelectric vibrator according to the first embodiment, is the enlarged cross-sectional view at the cutting places located in the same position as the cutting line A-A shown in FIG. 1 and the cutting line B-B shown in FIG. 3. In this fourth modified example, the same numeral reference is given to the component with the same name as the component described in the above-described embodiment or modified example.

The fourth modified example of this piezoelectric vibrator 1 and the first modified example of the piezoelectric vibrator 1 shown with FIG. 3 and FIG. 4 has the piezoelectric vibrator 1 in common with each other in relation to the mount part the vibrating piece 10, but for the mount part 11 of the vibrating piece 10, their is different in that the position of the two leads 12 passing through the airtight terminal 13 is eccentric from the central axis of the airtight terminal 13.

As shown in FIG. 7, the line connecting the center C1, C2 of the two leads 12 respectively is eccentric by distance e from the central axis Cv of the airtight terminal 13 which is the center of the case 16. That is, in the embodiment described up to now or the airtight terminal 13 in the first to the third modified examples, e in this fourth modified example has the predetermined distance for the distance corresponding to this e is about zero. In this example, e is about half of the diameter of the lead 12, if the size of this degree, although the lead approaches the out circumference of the airtight terminal 13, electrical insulation is not affected.

The level difference g is provided in the two places in one side of the mount part 11 in the lead 12 eccentric from this airtight terminal 13, and the vibrating piece 10 forming the thin portion 14 formed in two places is connected, the vibrating piece 10 can be disposed to center in the case 16 of the piezoelectric vibrator 1.

In the above third modified example, although the vibrating piece 10 can be disposed to the center of the piezoelectric vibrator 1, in the third modified example, since it is necessary that the thin portion 14 is formed by providing the level difference g in both sides of the vibrating piece 10, there is the possibility that the number of processes increases. Correspondingly, in the fourth modified example, the level difference g is provided only in one side of the vibrating piece 10 and is simultaneously formed to form the thin portion 14.

As described above, in the piezoelectric vibrator of this first embodiment, more miniaturization is possible without damaging the electrical insulation, simultaneously, the mount accuracy and the mount strength into the lead of the vibrating piece is improved, and the stabilization of vibrating characteristics is achieved and can be manufactured at low cost.

Second Embodiment

Next, the second embodiment of the piezoelectric vibrator according to the present invention will be described. The piezoelectric vibrator of the second embodiment differs from the piezoelectric vibrator of the first embodiment in that the plane portion is formed in the connecting portion where two leads 12 passing through the airtight terminal 13 are connected with the vibrating piece 10. Since the other constituent components and the manufacturing method are common to the first embodiment, the repeated explanation is omitted.

Figure 8A:
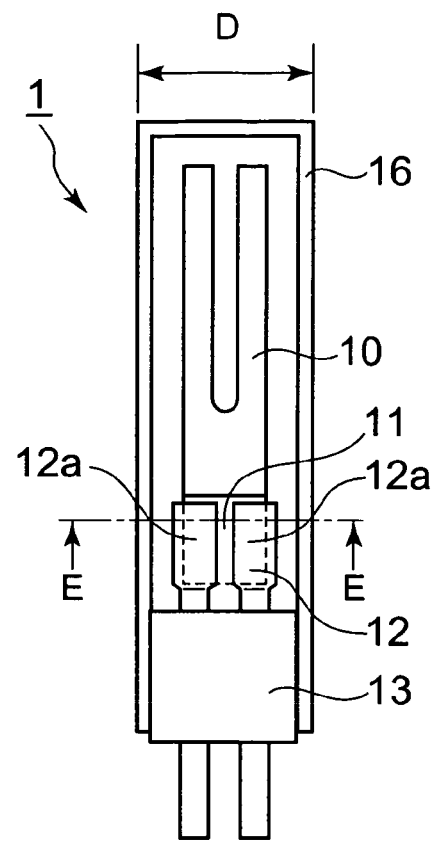
FIGS. 8A and 8B are a view showing an example of piezoelectric vibrator according to the second embodiment.
Figure 8B:
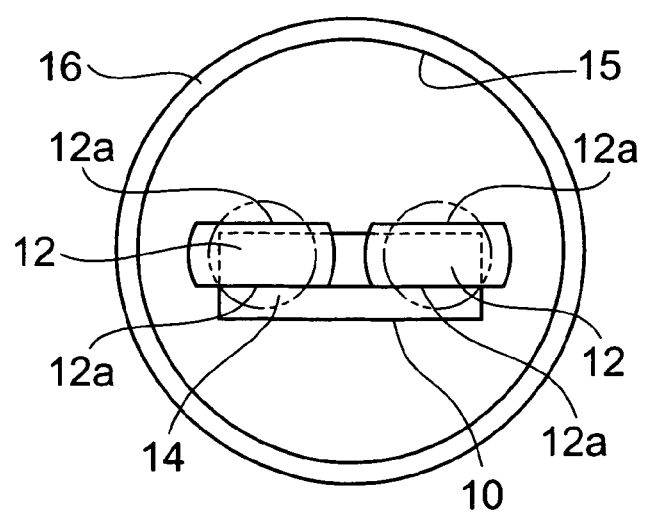

FIGS. 8A and 8B are a view which shows an example of the piezoelectric vibrator according to the second embodiment, FIG. 8A is a cross-sectional view which shows internal structure by vertically cutting the cylindrical case, and FIG. 8B is an enlarged cross-sectional view of the mount part taken along the cutting line E-E shown in FIG. 8A. Although the example shown in FIGS. 8A and 8B are similar to the example shown in FIGS. 1A, 1B and FIG. 2 for the first embodiment, there is difference in two leads 12.

As shown in FIG. 8A, the two leads 12 passing through the airtight terminal 13 increase the size and expand the area in the mount part 11 of the vibrating piece 10. As shown in FIG. 8B, the two leads 12, each of which has two sides respectively formed into a plane, is connected with vibrating piece 10 so that one planer side of each lead is connected to the thin portion 14 of the vibrating piece 10. In FIG. 8B, the circles shown with an imaginary line are drawn in a concentric circle of the respective two leads 12 shows the cross-sectional shape of the two leads 12 and the position in the region except for the mount part 11.

Although any cross-section of the two leads 12 initially shows a circular shape, in this embodiment, the plane portion 12a is provided over the whole side corresponding to the mount part 11 of the vibrating piece 10. In this embodiment, the lead 12 is sandwiched between two press metal molds having a plane, and press-molded when transforming a curved surface to a plane. In press molding, the mold should be formed such that the distance between leads 12 would not change or a jig or the like should be used. Although each lead 12 may have only one plane as a plane portion 12a, when one more plane is provided in 180° symmetrical position as the present embodiment, any side of the plane portion 12a can be connected with the vibrating piece 10. Therefore, the lead 12 can be positioned more easily when the vibrating piece 10 is connected thereto. Meanwhile, the cutting work, the grinding process or the like can be used for forming the plane portion 12a. However, it is necessary to retain the parallelism with central axis assumed from the cylindrical outer circumference of the airtight 13 with high accuracy.

When the plane portion 12a is configured on the side corresponding to the connecting portion 11 with the vibrating piece 10, it is considered to use a wire rod such that the whole cross-section of the lead 12 takes the form of a triangle or rectangle, and it is also considered to use a lead frame. However, in the case, there is the plane portion 12a in the connecting portion 11, the cross-sectional direction position of connected vibrating piece 10 is far away from the center position of the airtight terminal 13 or the case 16. In the present embodiment, it is important that the plane portion 12a is formed more inner position than the most outer circumference in the cross-section of the lead 12. The plane portion 12a in that position is connected to the vibrating piece 10, the vibrating piece 10 is received in the central position of the case 16.

In the plane portion 12a of these two leads, the solder plating is implemented for the connection to the vibrating piece 10 as the first embodiment. Although the solder plating is before the plane portion 12a is formed, since there is a possibility that the solder plating is deprived, it is preferable that the solder plating is implemented after forming the plane portion 12a.

The two leads 12 of in the embodiment as shown in FIG. 8B are positioned in the central position of the inner wall surface 15 of the case 16. Since the inner wall surface 15 of the case 16 corresponds to the outer circumference of the airtight terminal 13, the two leads 12 is disposed in the central position of the airtight terminal 13. Therefore, since the distance to the metallic ring of the periphery of the airtight terminal 13 is enough acquired with the lead 12, the problem of the insulation failure does not occur.

Hereinafter, in case that the vibrating piece 10 is connected to the plane portion 12a of the lead 12, and in case that the vibrating piece 10 is connected to the lead 12 of conventional fine solid-core round bar, comparative testing result of drop shock resistance performance by mount strength and drop shock is described by referring to figure and the table. Hereinafter, it is called condition A the case that the vibrating piece 10 is connected to the plane portion 12a according to the present invention, it is called condition B the case that the vibrating piece 10 is connected to the lead 12 of conventional fine solid-core round bar.

Figure 9A:
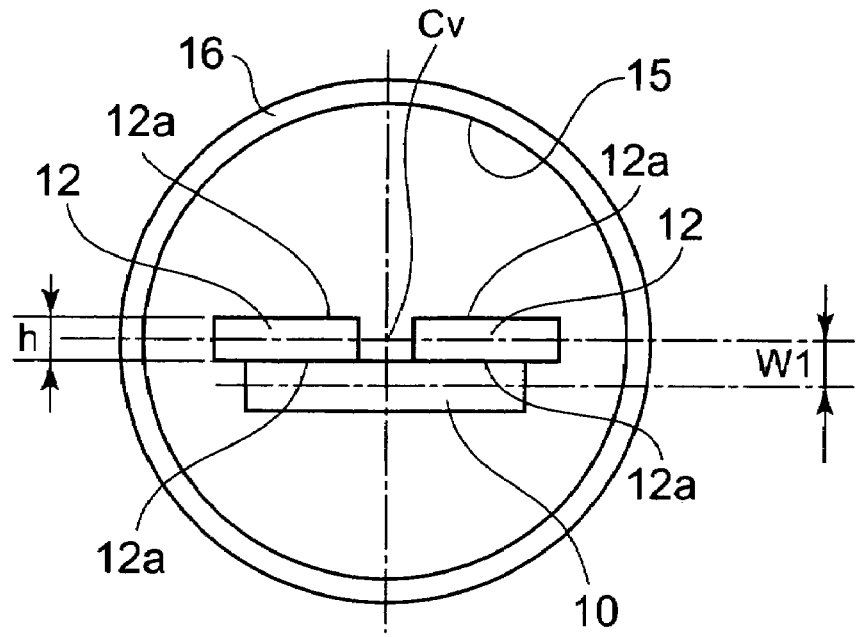
FIGS. 9A and 9B are a view showing a mount part of the piezoelectric vibrator used in comparative test.
Figure 9B:
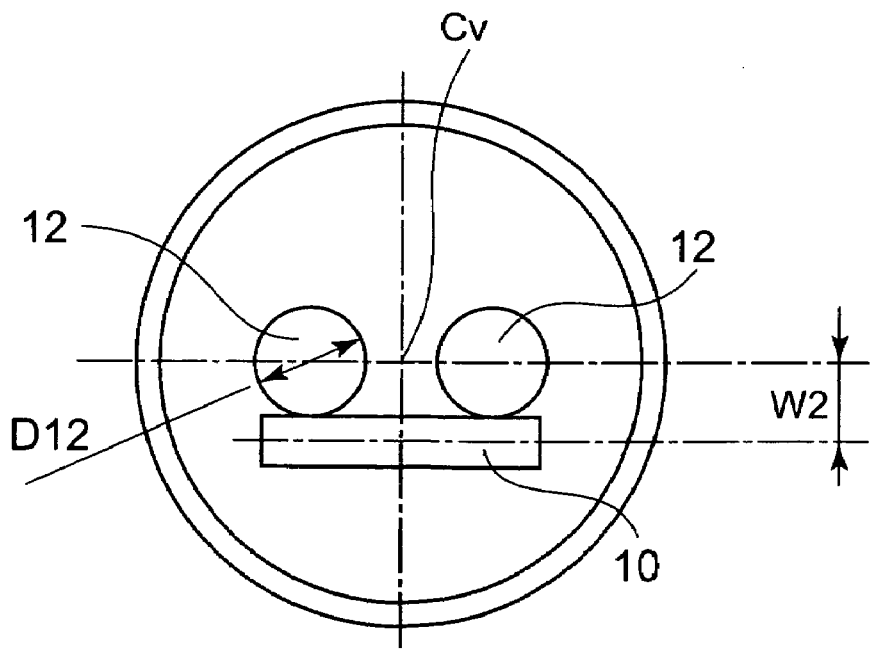

FIGS. 9A and 9B are a view which shows the mount part of the piezoelectric vibrator used to comparative testing of the mount strength and the drop shock resistance performance, FIG. 9A is a cross-sectional view which shows the mount part of condition A according to the present invention, and FIG. 9B is a cross-sectional view showing the mount part of the conventional condition B. As shown in FIGS. 9A and 9B, the thin portion is not provided by the level difference in the vibrating piece 10 with condition A and condition B. This exists by making the vibrating piece 10 common since the mount strength and, the drop shock resistance performance by comparing only the difference of shape of connecting portion of the lead 12. Moreover, with condition A and condition B, the line connecting the center of the two leads 12 is structure which passes through the central axis of case 16, that is, the center of the airtight terminal Cv.

In the mount part of condition A in FIG. 9A, the thickness h of the lead 12 having two plane portions 12a respectively is 90 µm. Correspondingly, the diameter D12 of the lead 12 of solid-core round bar is 220 µm in the mount part of condition B of FIG. 9B. Therefore, the distance W1 between the line connecting the center of two leads 12 and the center line of the vibrating piece 10 in the condition A has the difference 65 µm from the distance W2 between the line connecting the center of two leads 12 and the center line of the vibrating piece 10 in the condition B. The vibrating piece 10 in the condition A approaches the central axis of the case 16 by 65 µm.

Here, the mount strength is the measurement of impressed load when the vibrating piece 10 and the lead 12 is pulled and deprived in case that the neighborhood of the mount part of the vibrating piece 10 is applied by the pressure after the vibrating piece 10 is connected. However, in case that the vibrating piece 10 is strongly connected, the vibrating piece 10 is broken before, the vibrating piece 10 deprived, in this case, the load when the vibrating piece 10 is broken is employed. As mount strength testing, it is preferable that the vibrating piece 10 is broken before the vibrating piece 10 is deprived from the lead 12 in this way. The number of testing sample used in mount strength test is 22 in the condition A and B.

Meanwhile, the drop shock resistance performance checks of the degree, of resonance frequency change before and after drop test. After the airtight terminal in which vibrating piece 10 is connected to the lead 12 is injected, connected, sealed in the case 16, first, the resonance frequency before drop test is measured. Then, drop test is implemented. In drop test, the piezoelectric vibrator to be assembled is dropped on the concrete from the height 75 cm in any posture. Then, the resonance frequency is measured again. Here, the variation of resonance frequency (the difference of the resonance frequency before and after the drop test) is the data by dividing the resonance frequency before and after drop test. Moreover, the standard value of drop shock resistance performance is set up within the variation of the resonance frequency ±5 ppm. The number of the samples for checking the drop shock resistance performance is 110 in the condition A and condition B.

First, the result which measures the mount strength acquires the result that the mount strength in the condition A is comparatively higher than the mount strength in condition B by the 1.45 times average value. Meanwhile, the standard deviation showing the disparity of the mount strength of condition A is suppressed than that of condition B by 48%. As described above, the connection of the vibrating piece 10 by the lead 12 having the plane portion 12a suppresses the disparity of the mount strength small as well as the high mount strength is realized.

Next, comparative result of the drop shock resistance performance is described based on the table. Table 1 shows the result that the drop shock resistance performance is compared with above-described condition A and condition B different in the structure of the mount part.

TABLE 1

Comparative result of drop shock resistance performance (Comparative result of frequency variation before and after drop test)

| | Condition A (Case of lead with plane portion) | Condition B (Case of lead of solid-core round bar) |
|---|---|---|
| Average value (ppm) | 0.34 | 0.78 |
| Standard deviation (ppm) | 0.76 | 1.25 |
| Maximum value (ppm) | 2.64 | 3.49 |
| Negative maximum value (ppm) | −1.17 | −2.14 |
| Cpk | 2.05 | 1.13 |

As shown in Table 1, comparative items are five items such as average value, standard deviation, maximum value, negative maximum value, Cpk. Here, the maximum value is the maximum variation, and the negative maximum value is the maximum variation in the negative side in which resonance frequency after testing is changed in low side.

In table 1, if the variation of the resonance frequency before and after drop test is compared in condition A and condition B, all the five items are excellent in condition A, that is, in the sample in which the vibrating piece 10 is connected to the lead 12 providing the plane portion 12a. For example, since the average value is 0.34 ppm in case of condition A, 0.78 ppm in case of condition B, the variation in condition A is small. Moreover, since the standard deviation showing the disparity is 0.76 ppm in condition A, 1.25 ppm in condition B, condition A has small disparity. Furthermore, since the maximum variation is 2.64 ppm in condition A, 3.49 ppm in condition B, condition A has small variation. Moreover, since the maximum variation of the negative side is −1.17 in condition A, −2.14 in condition B, condition A has maximum variation of the negative side. Furthermore, if Cpk is computed in the drop test, since condition A has 2.05, condition B has 1.13, it is judged that condition A is stabilized enough in the drop test.

Here, Cpk is briefly described. Cpk is a coefficient showing the stability of the process used in the quality management field. The numerical value is computed by using standard value, the average value, the standard deviation. Cpk of process is computed, and then in case that the numerical value is larger than 1.33, the disparity in process is small enough, and regarded as a stable process. Meanwhile, in case that it is smaller than 1.33, it is shown that the large disparity for the process occurs. In case of the drop shock resistance performance by above-described drop test, the mount process implemented with the condition A is large as 2.05, accordingly stable, in conventional condition B, since Cpk is 1.13, it is numerically exemplified that there is room for improvement.

As above described, compared with the lead 12 of conventional solid-core round bar, the connection area is wide, it is used the lead 12 having the plane portion 12a giving the vibrating piece 10 to the center of case 16, the mount strength and the disparity has been improved. In the impact load as the drop test, it is apparent that the variation of the frequency is suppressed. In the two kind of comparative test in this time, although the thin portion 14 is not formed in the vibrating piece 10, if the thin portion 14 is formed, since the vibrating piece 10 further approaches the center axis of the case 16, furthermore since the weight of the piezoelectric piece 10 itself is reduced, it is conceived that the drop shock resistance performance is better. In the mount strength, the thin portion 14 is provided, and it is conceived that it becomes the direction where the vibrating piece 10 is broken before, desirable direction becomes.

However, if too thin, since the strength of the vibrating piece 10 itself is reduced, as described in the first embodiment, the; depth of the level difference g is 70% or less than the thickness of the vibrating piece 10, and it is preferable that the thickness of the thin portion 14 is 30% or more than the thickness of the vibrating piece 10. Moreover, in order to enlarge the connecting area in mount part 11 or improve the stability of positioning, in the present second embodiment, it is preferable that the vibrating piece 10 is configured same as the vibrating piece 10 shown in FIG. 4 described as the first modified example of the first embodiment. That is, two thin portion 14 is formed in one side by the level difference g in two places, and with shape remaining the original thickness t1 of the vibrating piece 10 between the thin portion 14, it is possible that the side portion is connected as well as the plane portion 12a of the lead 12.

Here, the modified example of the piezoelectric vibrator of the second embodiment is described based on the views.

Figure 10A:
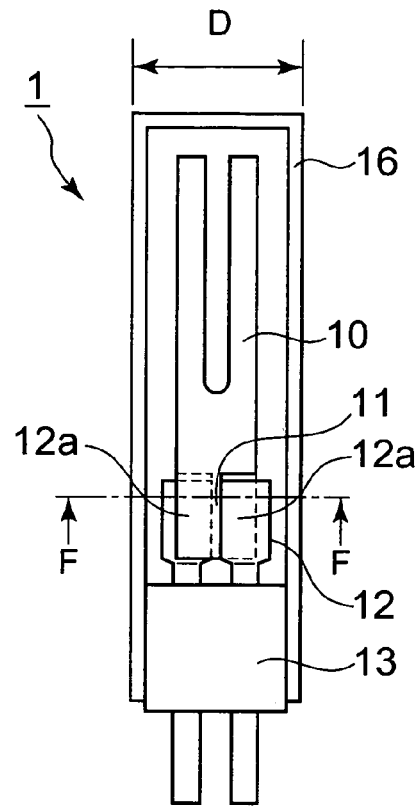
FIGS. 10A and 10B are a view showing a modified example of piezoelectric vibrator according to the second embodiment.
Figure 10B:
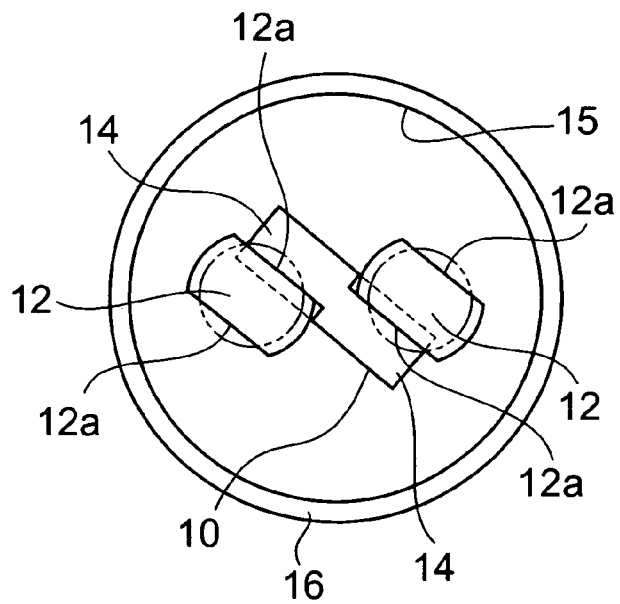

FIGS. 10A and 10B are a view which shows the modified example of piezoelectric vibrator according to the second embodiment, FIG. 10A is a view which shows the internal structure by vertically cutting the cylindrical case, FIG. 10B is an enlarged cross-sectional view taken along the cutting line F-F shown in FIG. 10A. In the piezoelectric vibrator shown in FIG. 10, the same numeral reference is given to the component with the same name as the component described in the above-described embodiment.

As shown in FIGS. 10A and 10B, this modified example of the second embodiment is the piezoelectric vibrator in which the vibrating piece 10 of the third modified example of the first embodiment shown in FIG. 6 is inserted between the two leads 12 having plane portion 12a. The thin portion 14 in the mount part 11 of the vibrating piece 10 is not formed in two places in one side of the vibrating piece 10, is formed to have one level difference respectively in both sides. Accordingly, the plain portion 12a of the two leads 12 to be connected is not formed on the same plane, each is formed on the different plane. The detailed description is omitted for the rest point as same as the above-described embodiment in the structure and the manufacturing method.

In this modified example, the vibrating piece 10 can be completely disposed in the center of the case 16 in addition to the effect as the above-described embodiment. Therefore, the clearance with the inner wall surface 15 of the case 16 and the vibrating piece 10 is largely acquired. Moreover, accordingly, it is possible that the size of the case 16 is miniaturized.

In the second embodiment, in the piezoelectric vibrator providing two leads 12 having the plain portion 12a, in addition to above-described modified example, it is possible that it is connected the vibrating piece 10 of the second modified example in the first embodiment shown in FIG. 5. Moreover, as shown in the fourth embodiment in the first embodiment of FIG. 7, the line connecting the center of each of the two leads 12 is eccentric from the airtight terminal 13, and it is possible that the vibrating piece 10 is positioned in the center of the case 16.

As described above, the piezoelectric vibrator 1 in the second embodiment retains the basic characteristics of the piezoelectric vibrator in the first embodiment, and further improves the mount strength, accordingly the drop shock resistance performance such as a drop, etc.

Third Embodiment

Next, the third embodiment of the piezoelectric vibrator according to the present invention is described based on the views.

Figure 11A:
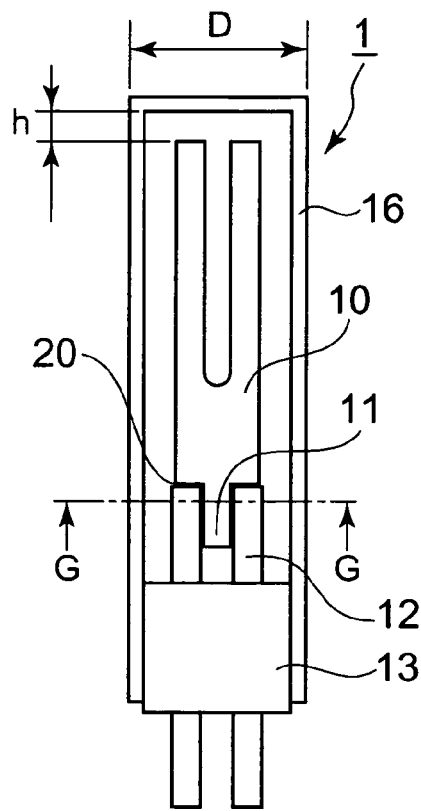
FIGS. 11A and 11B are a view showing an example of piezoelectric vibrator according to the third embodiment.
Figure 11B:
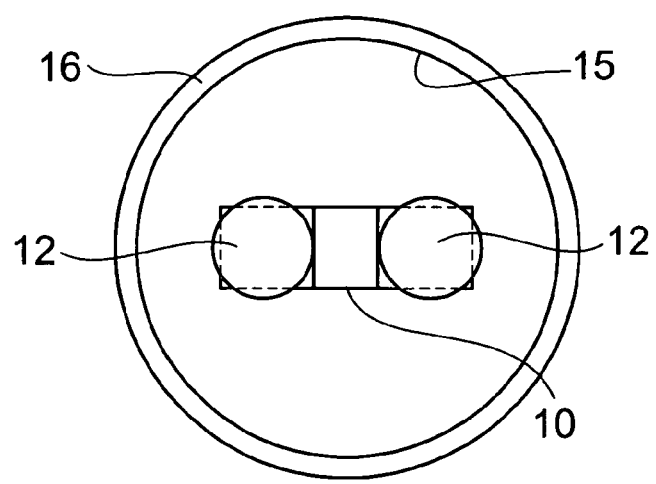

FIGS. 11A and 11B are a view which shows the example of the piezoelectric vibrator according to the third embodiment, FIG. 11A is a view which shows the internal structure by vertically cutting the cylindrical case, FIG. 11B is an enlarged cross-sectional view taken along the cutting line G-G shown in FIG. 11A.

As shown in FIGS. 11A and 11B, the piezoelectric vibrator 1 of the third embodiment is different from the piezoelectric vibrator of the second embodiment in the point that the central portion of the mount part 11 of the vibrating portion 10 remains with the original thickness t1, the thin portion 14 is not formed and completely removed by etching, and is formed block portion inserted into two leads 12. The connection to the lead 12 is implemented so that the circular end face of the lead 12 is connected to be abutted to the end face corresponding to the shoulder portion 20 of connecting portion 11 of the vibrating piece 10 each other. Furthermore, the plane portion is formed in connecting portion in which the two leads 12 passing through the airtight terminal 13 is connected to the vibrating piece 10. Other constituent components or manufacturing methods is common with the first embodiment or the second embodiment, the common explanation is omitted.

In the third embodiment, the connection of the vibrating piece 10 and the lead 12 acquires the large connection area with flat plane, done with plane. Furthermore, since the direction of the plane used in the connection differs from the case of the first embodiment or the second embodiment by 90 degree, specifically, the vibrating piece 10 of the longitudinal direction is accurately positioned. Therefore, it is necessarily suppressed to the minimum the clearance h of the front edge of the two vibrating arm portion of the vibrating piece 10 and the basal inner wall surface of the case 16.

Obviously, the connection of the vibrating piece 10 to the lead 12 in the third embodiment can be implemented in each other plane portion but also between the cylindrical side of the two leads 12 and the facing plane of the vibrating piece 10 therebetween. According to this, the connecting strength is retained enough. It goes without saying that the vibrating piece 10 is disposed in the center of the case 16.

Figure 12A:
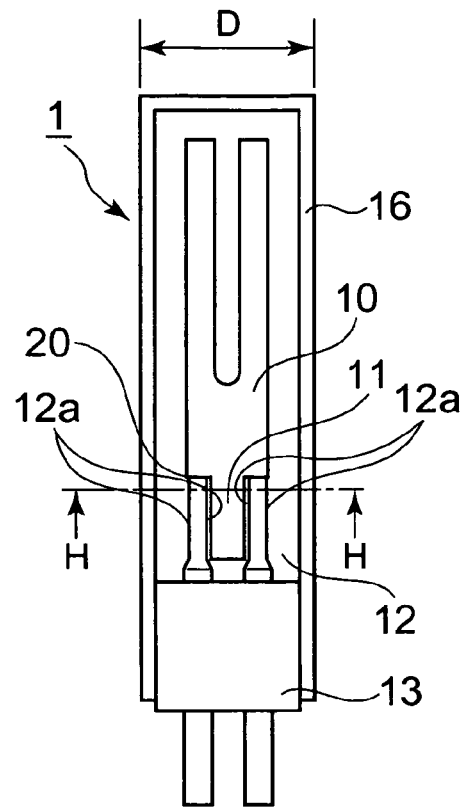
FIGS. 12A and 12B are a view showing a modified example of piezoelectric vibrator according to the third embodiment.
Figure 12B:
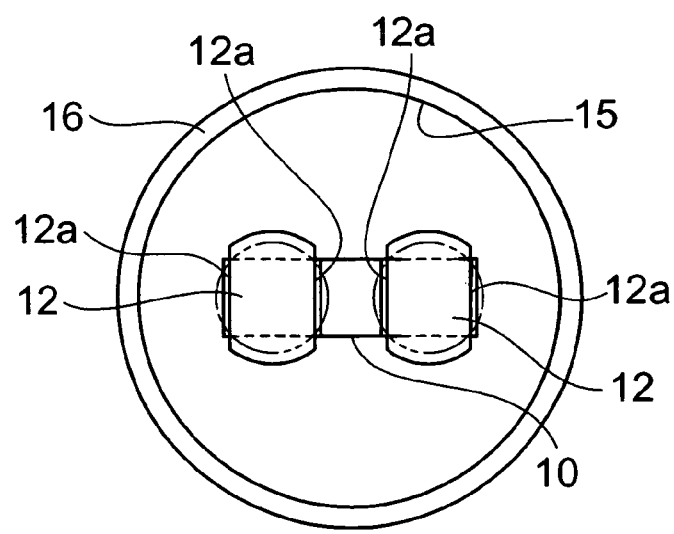

Here, the modified example of the piezoelectric vibrator of the third embodiment is described by referring to drawing. FIGS. 12A and 12B are a view which shows the modified example of the piezoelectric vibrator according to the third embodiment of the present invention, FIG. 12A is a view which shows the internal structure by vertically cutting the cylindrical case, FIG. 12B is an enlarged view of the mount part taken along the cutting line H-H shown in FIG. 12A.

This modified example is different in the point that the plane portion 12a is formed in the side of the two leads 12 as shown in FIG. 12B. Since there is the plane portion 12a, the distance between the two leads 12 is spread in the mount part 11. Since the distance between the two leads 12 is spread, the cross-sectional area of the mount part 11 of the vibrating piece 10 inserted therebetween is made larger than the case of the previous embodiment. Therefore, the shock resistant strength of the vibrating piece 10 becomes strong. Further, the contact area in the mount part is enlarged and the connecting strength is improved.

As described above, since the vibrating piece 10 is disposed in the center portion of the case 16 in the piezoelectric vibrator and the piezoelectric vibrator of the modified example of the first, second, and third embodiment to the present invention, all the piezoelectric vibrator can be more miniaturized. Therewithal, since the alignment mount accuracy or the mount strength is improved in the lead 12 and the vibrating piece 10, the disparity of the resonance frequency and the CI value is reduced and the characteristics is stabilized and improved.

Fourth Embodiment

Next, the fourth embodiment according to the present invention is described by referring to the drawing.

FIGS. 13A to 13E are a view which shows the structure of the surface-mounting type piezoelectric vibrator according to the fourth embodiment, FIG. 13A is the plan view shown from the upper side, FIG. 13B is the front view shown from the front, FIG. 13C is the bottom view shown from the bottom, FIG. 13D is the cross-sectional view taken along the cutting line I-I shown in FIG. 13A, FIG. 13E is the side view from the right side of the front view shown in FIG. 13B.

As shown in FIGS. 13B and 13D, this surface-mounting type piezoelectric vibrator is molded on the rectangular solid shape by the resin 30 around the piezoelectric vibrator 1 of the cylindrical package according to the present invention described up to now. In resin 30, the epoxy resin or the liquid crystal polymer is used The periphery of the cylindrical piezoelectric vibrator 1 is formed on the rectangular solid shape by resin 30, electrical and mechanical connection can be implemented on the print substrate used with the various electronic apparatuses through reflow solder together with other electronic parts, etc.

The structure is described in detail in the cross-sectional view, FIG. 13D. Each of the two leads 12 of the piezoelectric vibrator 1 is electrically connected to the two external electrode 34 formed on the lead frame, etc. used in the time of manufacturing through connecting portion 33. The external electrode terminal 34 provides the crank-shaped bend section 34a, the end of the counter side with the end connected to the lead 12 is exposed at the bottom of the resin 30.

In the end facing with the external electrode terminal 34 with piezoelectric vibrator 1 therebetween, since it is provided the dummy terminal 35 not electrically connected to the piezoelectric vibrator 1, the end is exposed in the bottom of the resin 30. In the dummy terminal 35, it is formed standing portion 35a which positions the piezoelectric vibrator 1 on the lead frame. This dummy terminal 35 is coupled with external electrode terminal 34, and completes the role of the surface-mounted mechanical connection. That is, in the surface of the external electrode terminal 34 and the dummy terminal 35, since the metallic film not shown in views is formed with plating, etc., has the wettability in the solder of the substrate, etc.

In the inside of the surface-mounting type piezoelectric vibrator, the outer size of the surface-mounting type piezoelectric vibrator is downsized by using the piezoelectric vibrator 1 of the cylindrical package according to the present invention. The electronic apparatuses such as mobile device, etc. using this compact surface-mounting type piezoelectric vibrator can be more miniaturized. Furthermore, since it is improved the mount strength of the vibrating piece of the piezoelectric vibrator 1 of the inside of the surface-mounting type piezoelectric vibrator and the drop shock resistance performance is improved, the reliability of the used electronic apparatuses is more improved.

Fifth Embodiment

Figure 14:
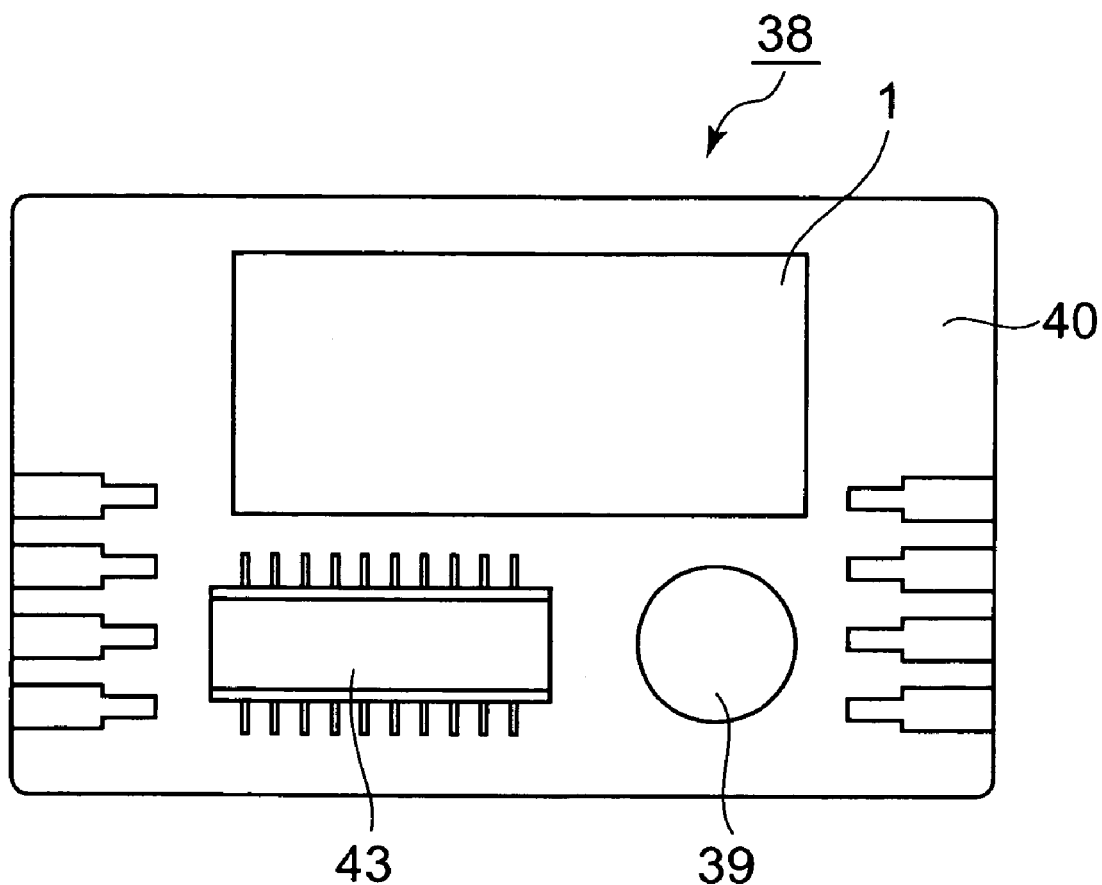
FIG. 14 is a view showing a structure of the oscillator according to the fifth embodiment.

Next, the fifth embodiment according to the present invention will be described with reference to FIG. 14. FIG. 14 is a view which shows the structure of the oscillator according to the fifth embodiment.

As shown in FIG. 14, the oscillator 38 is configured with the piezoelectric vibrator 1 of the first to third embodiment or the surface-mounted vibrator used as the oscillating device.

The oscillator 38 provides the substrate 40 in which the electronic component 39 such as condenser, etc. is mounted. Since the integrated circuit 43 for an oscillator is mounted on the substrate 40, the quartz crystal vibrator 1 is mounted in neighborhood of the integrated circuit 43. These electronic component 39, integrated circuit 43 and quartz crystal vibrator 1 is electrically connected through the wiring pattern not shown in views. Additionally, each constituent component is molded with the resin not shown in views.

Under these structure, if the quartz crystal vibrator 1 is applied by the voltage, above-described quartz crystal vibrating piece is vibrated, and the vibration is transformed to electrical signal by the piezoelectric characteristics of the quartz crystal, and the electrical signal is input to the integrated circuit 43. The input electrical signal is processed by the integrated circuit 43, and outputted as the frequency signal. Accordingly, the piezoelectric vibrator 1 is functioned as an oscillating device.

Moreover, the structure of the integrated circuit 43 is selectively set up in response to the call of, for example, RTC (real time clock) module, etc., and it is provided that operating date or time of the corresponding device or external device is controlled, or the function providing the time or calendar, etc. can be given as well as the mono functional oscillator for the clock.

Therefore, according to the oscillator 38 of the present invention, there can be obtained not only the same effect as the piezoelectric vibrator 1 according to the above first to third embodiment or the surface-mounting type piezoelectric vibrator according to the fourth embodiment, but also the frequency stabilized with high accuracy is obtained for the long term.

Sixth Embodiment

Next, it is described the sixth embodiment according to the present invention. In the present embodiment, the piezoelectric vibrator 1 in the first to third embodiment is described for the mobile information device as the electronic apparatus providing the surface-mounting type piezoelectric vibrator in the fourth embodiment by referring to FIG. 15.

Figure 15:
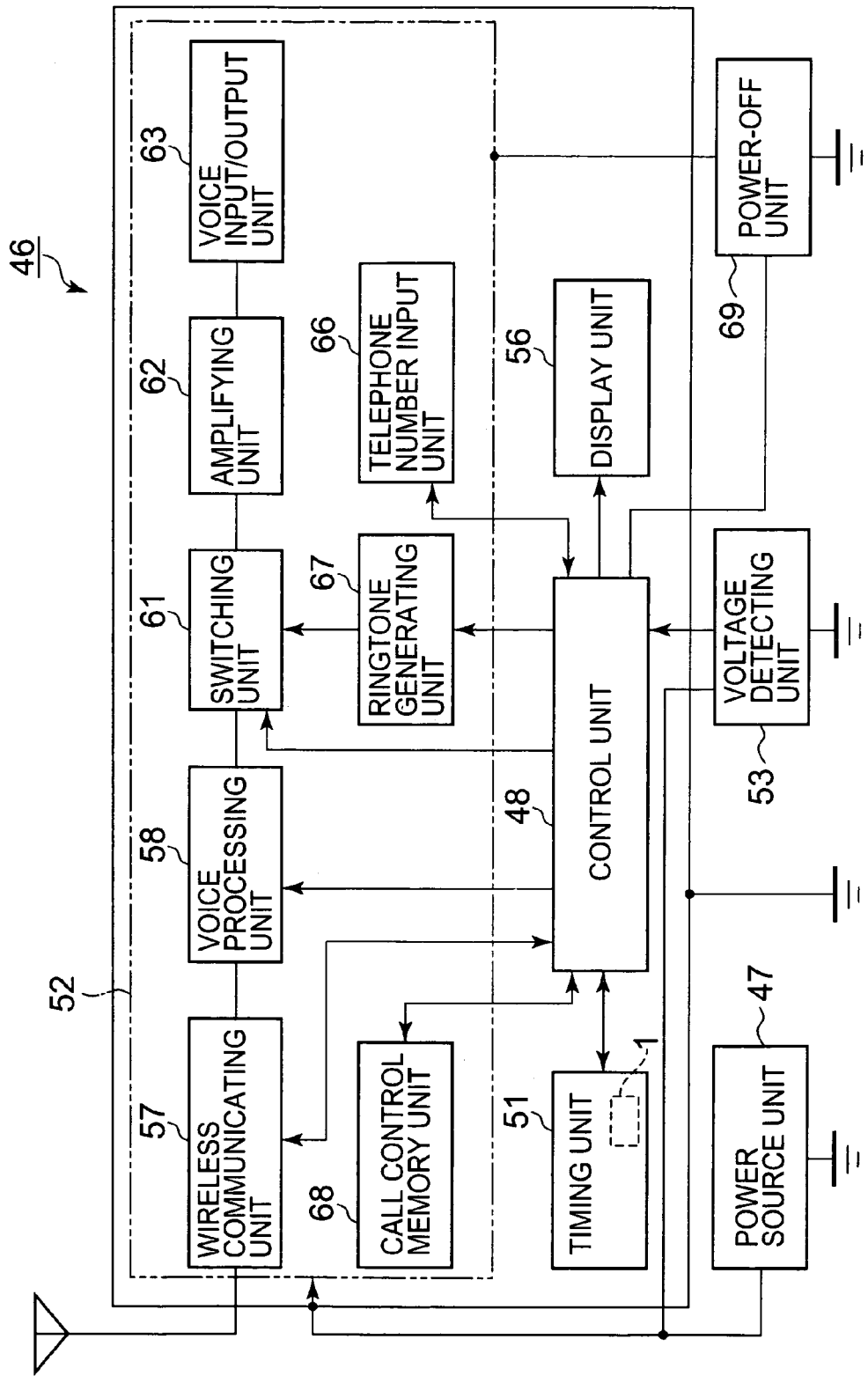
FIG. 15 is a view showing a functional structure of the mobile information device according to the sixth embodiment.

FIG. 15 is a view which shows the functional structure of the mobile information device according to the sixth embodiment.

As shown in FIG. 15, the mobile information device 46 provides the power source unit 47 which supplies the electrical power. The power source unit 47 has, for example, lithium secondary battery.

The power source unit 47 is connected in parallel to the control unit 48 which implements the various control, a timing unit 51 counting time, etc., a communication unit 52 which communicate with an external, a display unit 56 which displays the various information, and a voltage detecting unit 53 which detects the voltage of each of the functional units. The electrical power is supplied to each functional unit by the power source unit 47.

The control unit 48 controls the operation of the whole system such as the transmission and reception of the voice data, the measurement and display of the current time, etc. Moreover, the control unit 48 has a ROM previously written with a program, a CPU which reads and writes the program in the ROM, and a RAM used with the work area of the CPU.

The timing unit 51 includes the integrated circuit which incorporates an oscillation circuit, a register circuit, a counter circuit, and an interface circuit, etc. and the quartz crystal vibrator 1. If the quartz crystal vibrator 1 is applied by the voltage, the above-described quartz crystal vibrating piece is vibrated, the vibration is converted to electrical signal by the piezoelectric characteristics, and the electrical signal is input to the oscillation circuit. The output of the oscillation circuit becomes binary value, and is counted by the register circuit and the counter circuit. The signal is transmitted and received by the control unit 48 through the interface circuit; and the current time or the current date or calendar information is displayed on the display unit 56.

The communication unit 52 has the function same as conventional cellular phone, and a wireless communicating unit 57, a voice processing unit 58, a switching unit 61, an amplifying unit 62, a voice input/output unit 63, telephone input unit 66, a ringtone generating unit 67, and a call control memory unit 118.

The wireless unit 57 transmits and receives the various data such as the voice data, etc. through the antenna to and from the base station. The voice processing unit 58 encodes and decodes the voice signal inputted from the wireless communicating unit 57 or the amplifying unit 62. The amplifying unit 62 amplifies to the predetermined level the signal inputted from the voice processing unit 58 or the voice input unit 63. The voice input/output unit 63 having a speaker, a microphone and the like amplifies the ringtone or the received voice, or collects the speaker's voice.

Moreover, the ringtone generating unit 67 generates the ringtone in response to the call from the base station. The switching unit 61, only in the reception, switches the amplifying unit 62 connected to the voice processing unit 58 to the ringtone generating unit 67, and the ringtone generated in the ringtone generating unit 67 is output to the voice input/output unit 63 through the amplifying unit 62. Furthermore, call control memory unit 68 stores the program relating to the sending/receiving call control of communication. Moreover, since the telephone number input unit 66 has number key of 0 to 9 and other key, the telephone number of a receiving party is inputted by holding down these keys.

In case that it is under the predetermined value the voltage applied to each of the functional components such as the control unit 48, etc. by the power source unit 47, the voltage detecting unit 53 detects the voltage drop and informs the voltage drop to the control unit 48. The predetermined voltage value in this time is the value previously set up as the minimum voltage necessary to operate the communication unit 52, for example, about 3 V. The control unit 48 informed with voltage drop from the voltage detecting unit 53 prohibits the operation of the wireless communicating unit 57, the voice processing unit 58, the switching unit 61, and the ringtone generating unit 67. Specifically, the operation stop of the wireless unit 57 with electrical power consumption is necessary. Furthermore, on the display unit 56, it is displayed the notification that the communication unit 52 is out of service from shortage of battery power.

That is, the operation of the communication unit 52 is prohibited by the voltage detecting unit 53 and the control unit 48, and the notification can be displayed on the display unit 56. It is not bad that this display is character message, it is preferable that X mark is in the telephone icon marked on the top of the display surface of the display unit as more intuitive mark.

Further, since the mobile information device 46 has the power-off unit 69 which can selectively cut off the power source relating to the function of the communication unit 52, the function of the communication unit 52 is certainly stopped by this power-off unit 69.

Therefore, according to the mobile information device 46 of the present embodiment, it can be played the effect same as the piezoelectric vibrator 1 in the first to third embodiment or the surface-mounting type piezoelectric vibrator according to the fourth embodiment, and timing information stabilized with high accuracy can be displayed for the long term.

Seventh Embodiment

Next, it is described the seventh embodiment according to the present invention. In the present invention, it is described by referring to views the wave clock which connects to filter unit the piezoelectric vibrator 1 in the first to third embodiment or the surface-mounting type piezoelectric vibrator in the fourth embodiment.

Figure 16:
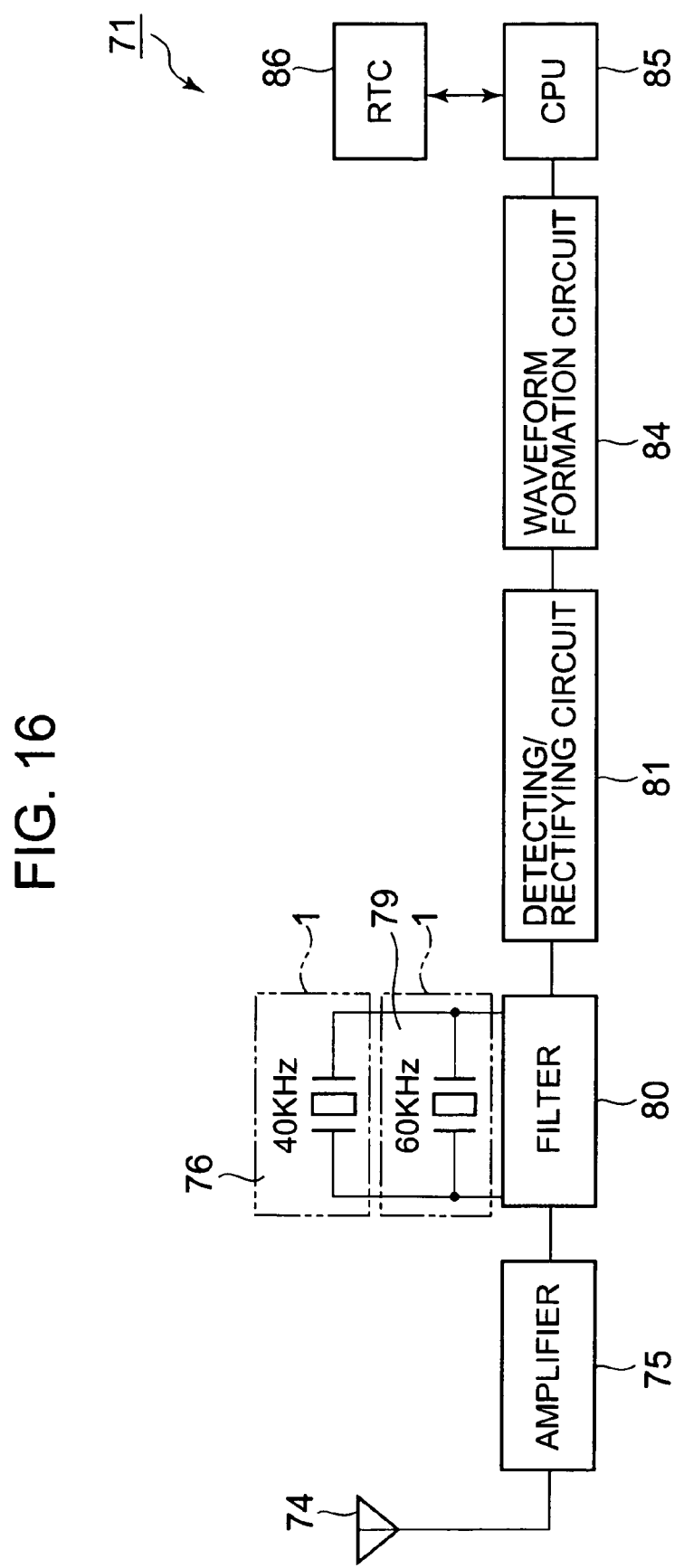
FIG. 16 is a view showing a structure of the wave clock according to the seventh embodiment.
Figure 17A:
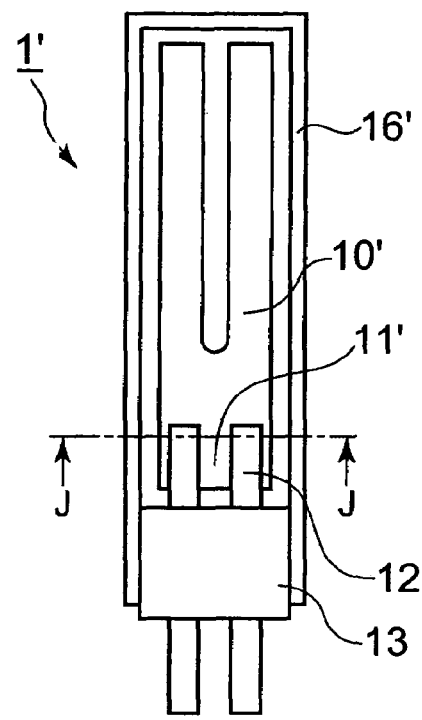
FIGS. 17A and 17B are a view showing an example of the conventional cylindrical piezoelectric vibrator.
Figure 17B:
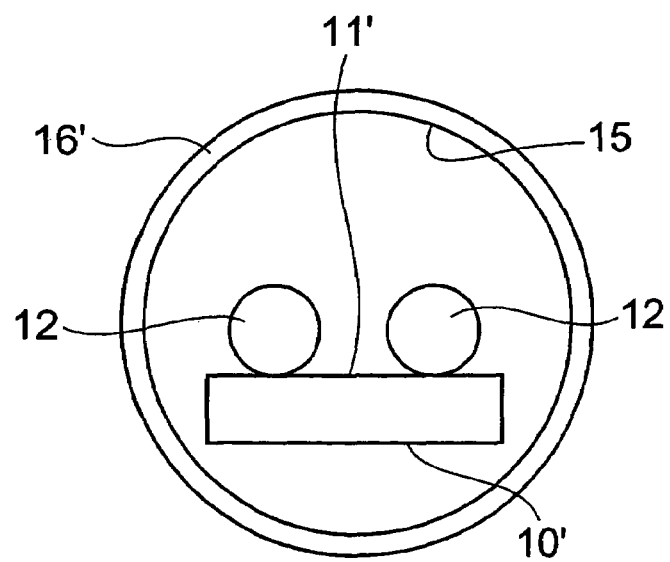

FIG. 16 is a view which shows the structure according to the seventh embodiment. The wave clock 71 receives the standard radio waves which include the time information, and is the clock having the displaying function with automatic correlation at accurate time. In Japan, there is transmitting stations (transmitter station) which transmit radio frequency to Fukushima-prefecture (40 KHz) and Saga-prefecture (60 KHz), the stations transmit the standard radio frequency respectively. Since the long wave such as 40 KHz or 60 KHz has a property which propagates the land surface and a property which propagates with reflected at ionosphere and land surface, the above-described two transmitting stations cover all area of Japan.

The functional structure of the wave clock 71 is described by referring to FIG. 16. Antenna 74 receives the standard long radio wave of the above 40 KHz or 60 KHz. The standard long wave put AM modulation on the time information called as a time code on the carrier wave of the 40 KHz or 60 KHz.

The received long standard radio wave is amplified by amplifier 75, filtered and tuned by the filter 80 having piezoelectric vibrator 1. The piezoelectric vibrator 1 in the present embodiment has the quartz crystal vibrating unit 76, 79 having resonance frequency of 40 KHz and 60 KHz same as the above carrier frequency.

Furthermore, the signal of the filtered predetermined frequency is detected and demodulated by the detecting/rectifying circuit 81. Subsequently, the time code is extracted through the waveform shaping circuit 84, and counted by CPU 85. In CPU 85, the information such as the present year, counted date, a day of the week, time, etc. is read. The read information is reflected to RTC 86 and the accurate time information is displayed.

Since carrier wave is 40 KHz or 60 KHz, the quartz crystal vibrating unit 76, 79 is very suitable for the vibrator having the above-described tuning fork shape structure. For example, in 60 KHz, it can be configured that the whole length is about 2.8 mm, the width size of the base portion is about 0.5 mm for size example of the tuning fork shape vibrating piece.

As described above, according to the wave clock 71 in the present embodiment, the effect can not only be provided same as the piezoelectric vibrator 1 according to the above first to third embodiment or the surface-mounting type piezoelectric vibrator, but also operates the function of the filter stabilized with high accuracy for the long term, accordingly the reliability of the wave clock can be more improved.

Furthermore, the technical area of the present invention is not limited to the above-described embodiment, and various changes may be made without departing from the scope of the invention.

What is claimed is:

1. A piezoelectric vibrator comprising:
an airtight terminal having two leads;
a vibrating piece connected to the leads; and
a case covering a periphery of the vibrating piece and sealed on an outer circumference of the airtight terminal;
wherein a level difference is provided in a mount part of the vibrating piece fixed to the leads.

2. A piezoelectric vibrator according to claim 1; wherein the depth of the level difference is 20% or more and 70% or less of the thickness of the vibrating piece.

3. A piezoelectric vibrator according to claim 1; wherein the level difference is provided at two places of one side of the vibrating piece.

4. A piezoelectric vibrator according to claim 1; wherein the level difference is provided at each one place of both sides of the vibrating piece, respectively, and is connected to interpose the vibrating piece between the two leads.

5. A piezoelectric vibrator according to claim 1; wherein a center of a line segment connecting a line diameter center of each of the two leads is eccentric from a central axis of the airtight terminal in the piezoelectric vibrator.

6. An oscillator comprising: an oscillating device and a piezoelectric vibrator according to claim 1 connected to the oscillating device.

7. An electronic apparatus comprising: a timing unit and a piezoelectric vibrator according to claim 1 connected to the timing unit.

8. A wave clock comprising: a filter unit and a piezoelectric vibrator according to claim 1 connected to the filter unit.

9. A piezoelectric vibrator comprising:
an airtight terminal having a plurality of leads, each of the leads having a plane portion;

a vibrating piece comprised of a first part having a preselected thickness and a second part having a thickness smaller than the preselected thickness, the plane portion of each of the leads being connected to the second part of the vibrating piece; and a case covering a periphery of the vibrating piece and sealed on an outer circumference of the airtight terminal.

10. A piezoelectric vibrator according to claim 9; wherein the thickness of the second part of the vibrating piece is 30% or more and 80% or less of the thickness of the first part of the vibrating piece.

11. A piezoelectric vibrator according to claim 9; wherein the second part is formed to have a level difference only in one side of the vibrating piece.

12. A piezoelectric vibrator according to claim 9; wherein the second part is formed to have a level difference in respective sides of the vibrating piece and is connected to interpose the vibrating piece between the two leads.

13. A piezoelectric vibrator according to claim 9; wherein a center of a line segment connecting a line diameter center of each of the two leads is eccentric from a central axis of the airtight terminal in the piezoelectric vibrator.

14. A piezoelectric vibrator comprising:
   an airtight terminal having a plurality of leads, each of the leads having an end face;
   a vibrating piece comprised of a mount part having a plurality of notched portions each having an end face, the end faces of the leads being connected to and disposed in abutment with the respective end faces of the notched portions; and
   a case covering a periphery of the vibrating piece and sealed on an outer circumference of the airtight.

15. A piezoelectric vibrator according to claim 14; wherein each of the leads has a plane portion in a side face thereof, the plane portions of the leads interposing the vibration piece.

16. A surface-mounting type piezoelectric vibrator comprising:
   a mold resin covering a surface of a piezoelectric vibrator; and
   an external electrode terminal partially exposed from the mold resin;
   wherein the piezoelectric vibrator comprises an airtight terminal having two leads, a vibrating piece connected to the leads, and a case covering a periphery of the vibrating piece and sealed on an outer circumference of the airtight terminal, and
   wherein a level difference is provided in a mount part of the vibrating piece fixed to the leads.

17. An oscillator comprising: an oscillating device and a surface-mounting type piezoelectric vibrator according to claim 16 connected to the oscillating device.

18. An electronic apparatus comprising: a timing unit and a surface-mounting type piezoelectric vibrator according to claim 16 connected to the timing unit.

19. A surface-mounting type piezoelectric vibrator comprising:
   a piezoelectric vibrator comprised of an airtight terminal with a plurality of leads each having a plane portion, a vibrating piece, and a case covering a periphery of the vibrating piece and sealed on an outer circumference of the airtight terminal, the vibrating piece comprising a first part having a preselected thickness and a second part having a thickness smaller than the preselected thickness, the plane portion of each of the leads being connected to the second part of the vibrating piece;
   a mold resin covering a surface of the piezoelectric vibrator; and
   an external electrode terminal partially exposed from the mold resin.

20. A surface-mounting type piezoelectric vibrator comprising:
   a piezoelectric vibrator comprised of an airtight terminal with a plurality of leads each having a plane portion, a vibrating piece, and a case covering a periphery of the vibrating piece and sealed on an outer circumference of the airtight terminal, the vibrating piece comprising a mount part having a plurality of notched portions each having an end face, the end faces of the leads being connected to and disposed in abutment with the respective end faces of the notched portions;
   a mold resin covering a surface of the piezoelectric vibrator; and
   an external electrode terminal partially exposed from the mold resin.

* * * * *